US006894532B2

(12) United States Patent
Forbes et al.

(10) Patent No.: US 6,894,532 B2
(45) Date of Patent: May 17, 2005

(54) PROGRAMMABLE LOGIC ARRAYS WITH ULTRA THIN BODY TRANSISTORS

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/321,975

(22) Filed: Dec. 17, 2002

(65) Prior Publication Data

US 2003/0107402 A1 Jun. 12, 2003

Related U.S. Application Data

(63) Continuation of application No. 09/780,087, filed on Feb. 9, 2001, now Pat. No. 6,496,034.

(51) Int. Cl.[7] .............................................. H03K 19/177
(52) U.S. Cl. ......................... 326/41; 326/102; 257/202; 257/302
(58) Field of Search .............................. 326/37–41, 44, 326/101, 102; 257/202, 302, 320, 333

(56) References Cited

U.S. PATENT DOCUMENTS

| | | | |
|---|---|---|---|
| 4,051,354 A | 9/1977 | Choate | 235/312 |
| 4,604,162 A | 8/1986 | Sobczak | 158/657 |
| 4,864,375 A | 9/1989 | Teng et al. | 357/23.6 |
| 4,896,293 A | 1/1990 | McElroy | 257/297 |
| 4,920,065 A | 4/1990 | Chin et al. | 437/62 |
| 4,926,224 A | 5/1990 | Redwine | 257/302 |
| 4,958,318 A | 9/1990 | Harari | 365/149 |
| 4,987,089 A | 1/1991 | Roberts | 437/34 |
| 5,006,909 A | 4/1991 | Kosa | 357/23.6 |
| 5,010,386 A | 4/1991 | Groover, III | 357/42 |
| 5,017,504 A | 5/1991 | Nishimura et al. | 437/40 |
| 5,021,355 A | 6/1991 | Dhong et al. | 437/36 |

(Continued)

OTHER PUBLICATIONS

Hergenrother, J..M. , "The Vertical Replacement–Gate (VRG) MOSFET: A 50nm Vertical MOSFET with Lithography–Independent Gate Length", *IEEE*, (1999),pp. 75–78.

Kalavade, P ..,et al. , "A Novel sub–10nm Transistor", *IEEE Device Research Conference*, Denver, Co.,(2000),pp. 71–72.

(Continued)

*Primary Examiner*—Don Le
(74) *Attorney, Agent, or Firm*—Schwegman, Lundberg, Woessner & Kluth, P.A.

(57) ABSTRACT

Structures and methods for programmable logic arrays are provided. In one embodiment, the programmable logic array includes a first logic plane and a second logic plane. The first logic plane receives a number of input signals. The first logic plane has a plurality of logic cells arranged in rows and columns that are interconnected to provide a number of logical outputs. The second logic plane has a number of logic cells arranged in rows and columns that receive the outputs of the first logic plane and that are interconnected to produce a number of logical outputs such that the programmable logic array implements a logical function. Each of the logic cells includes a vertical pillar extending outwardly from a semiconductor substrate. Each pillar includes a single crystalline first contact layer and a second contact layer separated by an oxide layer. Each logic cell further includes at least one single crystalline ultra thin vertical transistor that is selectively disposed adjacent the vertical pillar. The single crystalline vertical transistors have an ultra thin single crystalline vertical first source/drain region coupled to the first contact layer, an ultra thin single crystalline vertical second source/drain region coupled to the second contact layer; and an ultra thin single crystalline vertical body region which opposes the oxide layer and couples the first and the second source/drain regions.

31 Claims, 18 Drawing Sheets

U.S. PATENT DOCUMENTS

| | | | |
|---|---|---|---|
| 5,028,977 A | 7/1991 | K. O. Kenneth et al. | 357/43 |
| 5,037,773 A | 8/1991 | Lee et al. | 437/60 |
| 5,053,351 A | 10/1991 | Fazan et al. | 437/62 |
| 5,072,269 A | 12/1991 | Hieda | 357/23.6 |
| 5,110,752 A | 5/1992 | Lu | 437/47 |
| 5,122,848 A | 6/1992 | Lee et al. | 357/23.6 |
| 5,135,879 A | 8/1992 | Richardson | 437/43 |
| 5,156,987 A | 10/1992 | Sandhu et al. | 437/40 |
| 5,177,576 A | 1/1993 | Kimura et al. | 257/71 |
| 5,192,704 A | 3/1993 | McDavid et al. | 438/3 |
| 5,202,278 A | 4/1993 | Mathews et al. | 437/47 |
| 5,216,266 A | 6/1993 | Ozaki | 257/302 |
| 5,223,081 A | 6/1993 | Doan | 156/628 |
| 5,229,647 A | 7/1993 | Gnadinger | 257/785 |
| 5,241,211 A | 8/1993 | Tashiro | 257/506 |
| 5,254,499 A | 10/1993 | Sandhu et al. | 437/192 |
| 5,266,514 A | 11/1993 | Tuan et al. | 437/62 |
| 5,272,367 A | 12/1993 | Dennison et al. | 257/306 |
| 5,316,962 A | 5/1994 | Matsuo et al. | 437/52 |
| 5,320,880 A | 6/1994 | Sandhu et al. | 427/578 |
| 5,365,477 A | 11/1994 | Cooper, Jr. et al. | 365/174 |
| 5,379,255 A | 1/1995 | Shah | 365/185 |
| 5,382,540 A | 1/1995 | Sharma et al. | 437/52 |
| 5,392,245 A | 2/1995 | Manning | 365/200 |
| 5,414,287 A | 5/1995 | Hong | 257/316 |
| 5,427,972 A | 6/1995 | Shimizu et al. | 437/52 |
| 5,432,739 A | 7/1995 | Pein | 365/185 |
| 5,444,013 A | 8/1995 | Akram et al. | 437/60 |
| 5,445,986 A | 8/1995 | Hirota | 437/60 |
| 5,449,433 A | 9/1995 | Donohoe | 156/643.1 |
| 5,460,988 A | 10/1995 | Hong | 437/43 |
| 5,483,094 A | 1/1996 | Sharma et al. | 257/316 |
| 5,495,441 A | 2/1996 | Hong | 365/185.01 |
| 5,508,542 A | 4/1996 | Geiss et al. | 257/301 |
| 5,519,236 A | 5/1996 | Ozaki | 257/302 |
| 5,523,261 A | 6/1996 | Sandhu | 437/228 |
| 5,563,083 A | 10/1996 | Pein | 437/43 |
| 5,574,299 A | 11/1996 | Kim | 257/296 |
| 5,599,396 A | 2/1997 | Sandhu | 118/723.1 |
| 5,616,934 A | 4/1997 | Dennison et al. | 257/67 |
| 5,636,170 A | 6/1997 | Seyyedy | 365/205 |
| 5,640,342 A | 6/1997 | Gonzalez | 365/156 |
| 5,644,540 A | 7/1997 | Manning | 365/200 |
| 5,646,900 A | 7/1997 | Tsukude et al. | 365/205 |
| 5,691,230 A | 11/1997 | Forbes | 437/62 |
| 5,696,008 A | 12/1997 | Tamaki et al. | 437/40 |
| 5,705,415 A | 1/1998 | Orlowski et al. | 437/43 |
| 5,757,044 A | 5/1998 | Kubota | 257/316 |
| 5,869,369 A | 2/1999 | Hong | 438/259 |
| 5,874,760 A | 2/1999 | Burns, Jr. et al. | 257/315 |
| 5,885,864 A | 3/1999 | Ma | 438/253 |
| 5,888,868 A | 3/1999 | Yamazaki et al. | 438/258 |
| 5,891,773 A | 4/1999 | Saitoh | 438/259 |
| 5,909,618 A | 6/1999 | Forbes et al. | 438/242 |
| 5,936,274 A | 8/1999 | Forbes et al. | 257/315 |
| 5,952,039 A | 9/1999 | Hong | 427/79 |
| 5,973,352 A | 10/1999 | Noble | 257/315 |
| 5,973,356 A | 10/1999 | Noble et al. | 257/319 |
| 5,991,225 A | 11/1999 | Forbes et al. | 365/230.06 |
| 6,013,548 A | 1/2000 | Burns, Jr. et al. | 438/242 |
| 6,034,389 A | 3/2000 | Burns et al. | 257/301 |
| 6,040,218 A | 3/2000 | Lam | 438/259 |
| 6,072,209 A | 6/2000 | Noble et al. | 257/296 |
| 6,077,745 A | 6/2000 | Burns, Jr. et al. | 438/270 |
| 6,083,793 A | 7/2000 | Wu | 438/270 |
| 6,104,061 A | 8/2000 | Forbes et al. | 257/330 |
| 6,114,725 A | 9/2000 | Furukawa et al. | 257/330 |
| 6,124,729 A | 9/2000 | Noble et al. | 326/41 |
| 6,134,175 A | 10/2000 | Forbes et al. | 365/230.06 |
| 6,143,636 A | 11/2000 | Forbes et al. | 438/587 |
| 6,150,687 A | 11/2000 | Noble et al. | 257/302 |
| 6,153,468 A | 11/2000 | Forbes et al. | 438/257 |
| 6,174,784 B1 | 1/2001 | Forbes | 438/405 |
| 6,184,549 B1 | 2/2001 | Furukawa et al. | 257/302 |
| 6,208,164 B1 | 3/2001 | Noble et al. | 326/41 |
| 6,211,015 B1 | 4/2001 | Noble | 438/259 |
| 6,219,299 B1 | 4/2001 | Forbes et al. | 365/230.06 |
| 6,222,788 B1 | 4/2001 | Forbes et al. | 365/230.06 |
| 6,238,976 B1 | 5/2001 | Noble et al. | 438/259 |
| 6,252,267 B1 | 6/2001 | Noble, Jr. | 257/296 |
| 6,281,054 B1 | 8/2001 | Yeo | 438/149 |
| 6,377,070 B1 | 4/2002 | Forbes | 326/41 |
| 6,380,765 B1 | 4/2002 | Forbes et al. | 326/112 |
| 6,403,494 B1 | 6/2002 | Chu et al. | |
| 6,424,001 B1 | 7/2002 | Forbes et al. | 257/315 |
| 6,437,389 B1 | 8/2002 | Forbes et al. | 257/302 |
| 6,448,601 B1 | 9/2002 | Forbes et al. | 257/302 |
| 6,486,027 B1 | 11/2002 | Noble et al. | 438/259 |
| 6,496,034 B2 | 12/2002 | Forbes et al. | 326/41 |
| 6,531,727 B2 | 3/2003 | Forbes et al. | 257/302 |
| 6,559,491 B2 | 5/2003 | Forbes et al. | 257/296 |
| 6,566,682 B2 | 5/2003 | Forbes | 257/51 |
| 6,639,268 B2 | 10/2003 | Forbes et al. | 257/315 |
| 6,664,806 B2 | 12/2003 | Forbes et al. | 326/38 |
| 6,680,508 B1 | 1/2004 | Rudeck | 257/316 |
| 6,689,660 B1 | 2/2004 | Noble et al. | 438/268 |
| 6,720,216 B2 | 4/2004 | Forbes | 438/257 |
| 2002/0109138 A1 | 8/2002 | Forbes | 257/51 |
| 2003/0042512 A1 | 3/2003 | Gonzalez | 257/263 |
| 2004/0042256 A1 | 3/2004 | Forbes | 365/149 |

OTHER PUBLICATIONS

Xuan, P .,et al. , "60nm Planarized Ultra–thin Body Solid Phase Epitaxy MOSFETs", *IEEE Device Research Conference*, Denver, Co,(2002),pp. 67–68.

Asai, S., "Technology Challenges for Integration Near and Below 0.1 micrometer", *Proceedings of the IEEE, 85(4)*, Special Issue on Nanometer–Scale Science & Technology, (Apr. 1997), pp. 505–520.

Blalock, T, N., "A High–speed Sensing Scheme for 1T Dynamic RAMs Utilizing the Clamped Bit–line Sense Amplifier", *IEEE Journal of Solid–State Circuits, 27(4)*, (Apr. 1992), pp. 618–625.

Bomchil, G., "Porous Silicon: The Material and its Applications in Silicon–On–insulator Technologies", *Applied Surface Science, 41/42*, (1969), pp. 604–613.

Burnett, D., "Implications of Fundamental Threshold Voltage Vartations for High–Density SRAM and Logic Circuits", *1994 Symposium on VLSI Technology, Digest of Technical Papers*, Honolulu, HI, (Jun. 1994), pp. 15–16.

Burnett, D., "Statistical Threshold–Voltage Variation and its Impact on Supply–Voltage Scaling", *Proceedings SPIE: Microelectronic Device and Multilevel Interconnection Technology, 2636*, (1995), pp. 83–90.

De, V. K., "Random MOSFET Parameter Fluctuation Limits to Gigascale Integration (GSI)", *1996 Symposium on VLSI Technology, Digest of Technology, Digest of Technical Papers*, Honolulu, HI(Jun. 11–13, 1996), pp. 198–199.

Fong, Y., "Oxides Grown on Textured Single–Crystal Silicon—Dependence on Process and Application In EEPROMs", *IEEE Transactions on Electron Devices, 37(3)*, (Mar. 1990), pp. 583–690.

Fuse, T., "A 0.5V 200MHz 1–Stage 32b ALU Using a Body Bias Controlled SOI Pass–Gate Logic", *1997 IEEE International Solid–State Circuits Conference, Digest of Technical Papers*, (1997), pp. 286–287.

Gong, S., "Techniques for reducing switching noise in high speed digital systems", *Proceedings Eigth Annual IEEE International ASIC Conference and Exhibit,* (1995), pp. 21–24.

Hao, M. Y., "Electrical Characteristics of Oxynitrides Grown on Textured Single–Crystal Silicon", *Appl. Phys. Lett., 60,* (Jan. 1992), pp. 445–447.

Harada, M., "Suppression of Threshold Voltage Variation in MTCMOS/SIMOX Circuit Operating Below 0.5 V", *1996 Symposium on VLSI Technology, Digest of Technical Papers,* Honolulu, HI, (Jun. 11–13, 1996), pp. 96–97.

Hu, G., "Willi Flash Memory Replace Hard Disk Drive?", *1994 IEEE International Electron Device Meeting,* Panel Discussion, Session 24, Outline, (Dec. 1994), 2 pp.

Jun, Y. K., "The Fabrication and Electrical Properties of Modulated Stacked Capacitor for Advanced DRAM Applications", *IEEE Electron Device Letters, 13,* (Aug. 1992), pp. 430–432.

Jung, T. S., "A 117–mm2 3.3–V Only 128–Mb Multilevel NAND Flash Memory for Mass Storage Applications", *IEEE Journal of Solid–State Circuits, 31,* (Nov. 1996), pp. 1575–1583 .

Kim, Y. S., "Study on Pyrolysis DMEAA for Selective Deposition of Aluminum", *In: Advanced Metallization and Interconnect Systems for ULSI Applications in 1995,* R.C. Ellwanger, et al., (eds.), Materials Research Society, Pittsburgh, PA,(1996), pp. 675–680.

Koshida, N., "Efficient Visible Photoluminescene from Porous Silicon", *Japanese Journal of Applied Physics, 30,* (Jul. 1991), L1221–1223.

Lehmann, V., "The Physics of Macropore Formation in Low Doped n–Type Silicon", *Journal of the Electrochemical Society, 140(10),* (Oct. 1993),2836–2843.

Pein, H., "A 3–D Sidewall Flash EPROM Cell and Memory Array", *IEEE Transactions on Electron Devices, 40,* (Nov. 1993), pp. 2126–2127.

Pein, H., "Performance of the 3–D Pencil Flash EPROM Cell and Memory Array", *IEEE Transactions on Electron Devices, 42,* (Nov. 1995),1982–1991, 10 pp.

Pein, H. B., "Performance of the 3–D Sidewall Flash EPROM Cell", *IEEE International Electron Devices Meeting, Technical Digest,* (1993), pp. 11–14.

Sagara, K., "A 0.72 micro–meter2 Recessed STC (RSTC) Technology for 256Mbit DRAMs using Quarter–Micron Phase–Shift Lithography", *1992 Symposium on VLSI Technology Digest of Technical Papers,* Seattle, WA,(Jun. 2–4, 1992), pp. 10–11.

Saito, M., "Technique for Controlling Effective Vth in Multi–Gbit DRAM Sense Amplifier", *1996 Symposium on VLSI Circuits, Digest of Technical Papers,* Honolulu, HI,(Jun. 13–15, 1996), pp. 106–107.

Sherony, M. J., "Reduction of Threshold Voltage Sensitivity in SOI MOSFET's", *IEEE Electron Device Letters, 16,* (Mar. 1995), 100–102.

Shimomura, K. , "A 1V 46ns 16Mb SOI–DRAM with Body Control Technique", *1997 IEEE International Solid–State Circuits Conference, Digest of Technical Papers,* (Feb. 6, 1997), pp. 68–69.

Stellwag, T. B., "A Vertically–Integrated GaAs Biopolar DRAM Cell", *IEEE Transactions on Electron Devices,* (Dec. 1991),2704–2705.

Takato, H., "High Performance CMOS Surrounding Gate Transistor (SGT) for Ultra High Density LSIs", *IEEE International Electron Devices Meeting, Technical Digest,* (1988), pp. 222–225.

Temmler, D., "Multilayer Vertical Stacked Capacitors (MVSTC) for 84Mbit and 256Mbit DRAMs", *1991 Symposium on VLSI Technology, Digest of Technical Papers,* Oiso,(May 28–30, 1991), pp. 13–14.

Wang, P. W., "Excellent Emission Characteristics of Tunneling Oxides Formed Using Ultrathin Silicon Films for Flash Memory Devices", *Japanese Journal of Applied Physics, 35,* (Jun. 1996), pp. 3369–3373.

Watanabe, H. , "A Novel Stacked Capacitor with Porous–SI Electrodes for High Density DRAMs", *1993 Symposium on VLSI Technology, Digest of Technical Papers,* Kyoto, Japan, (1993), pp. 17–18.

Watanabe, H. , "An Advanced Fabrication Technology of Hemispherical Grained (HSG) Poly–Si for High Capacitance Storage Electrodes", *Extended Abstracts of the 1991 International Conference on Solid State Devices and Materials,* Yokohama, Japan,(1991), pp. 478–480.

Watanabe, H. , "Device Application and Structure Observation for Hemispherical–Grained Si", *J. Appl. Phys., 71,* (Apr. 1992), pp. 3538–3543.

Watanabe, H. , "Hemispherical Grained Silicon (HSG–SI) Formation on In–Situ Phosphorous Doped Amorphous–Si Using the Seeding Method", *Extended Abstracts of the 1992 International Conference on Solid State Devices and Materials,* Tsukube, Japan,(1992), pp. 422–424.

Yoshikawa, K. , "Impact of Cell Thresold Voltage Distribution in the Array of Flash Memories on Scaled and Multilevel Flash Cell Design", *1996 Symposium on VSLI Technology, Digest of Technical Papers,* Honolulu, HI, (Jun. 11–13, 1996), pp. 240–241.

PROGRAMMABLE LOGIC ARRAYS WITH ULTRA THIN BODY TRANSISTORS

CROSS REFERENCE TO RELATED APPLICATIONS

This application is a Continuation of U.S. application Ser. No. 09/780,087 filed on Feb. 9, 2001 now U.S. Pat. No. 6,496,034 which is incorporated herein by reference.

This application is related to the following co-pending, commonly assigned U.S. patent applications: "Open Bit Line DRAM with Ultra Thin Body Transistors,", Ser. No. 09/780,125, "Folded Bit Line DRAM with Ultra Thin Body Transistors,", Ser. No. 09/780,130, "Memory Address and Decode Circuits with Ultra Thin Body Transistors,", U.S. Pat. No. 6,448,601, "Programmable Memory Address and Decode Circuits with Ultra Thin Body Transistors,", Ser. No. 09/780,126, "In Service Programmable Logic Arrays with Ultra Thin Body Transistors,", U.S. Pat. No. 6,377,070, and "Flash Memory with Ultra Thin Vertical Body Transistors,", U.S. Pat. No. 6,424,001, which are filed on even date herewith and each of which disclosure is herein incorporated by reference.

TECHNICAL FIELD OF THE INVENTION

This invention relates generally to integrated circuits and in particular to programmable logic arrays with ultra thin body transistors.

BACKGROUND OF THE INVENTION

Logic circuits are an integral part of digital systems, such as computers. Essentially, a logic circuit processes a number of inputs to produce a number of outputs for use by the digital system. The inputs and outputs are generally electronic signals that take on one of two "binary" values, a "high" logic value or a "low" logic value. The logic circuit manipulates the inputs using binary logic which describes, in a mathematical way, a given or desired relationship between the inputs and the outputs of the logic circuit.

Logic circuits that are tailored to the specific needs of a particular customer can be very expensive to fabricate on a commercial basis. Thus, general purpose very large scale integration (VLSI) circuits are defined. VLSI circuits serve as many logic roles as possible, which helps to consolidate desired logic functions. However, random logic circuits are still required to tie the various elements of a digital system together.

Several schemes are used to implement these random logic circuits. One solution is standard logic, such as transistor—transistor logic (TTL). TTL integrated circuits are versatile because they integrate only a relatively small number of commonly used logic functions. The drawback is that large numbers of TTL integrated circuits are typically required for a specific application. This increases the consumption of power and board space, and drives up the overall cost of the digital system.

One alternative to standard logic is fully custom logic integrated circuits. Custom logic circuits are precisely tailored to the needs of a specific application. This allows the implementation of specific circuit architectures that dramatically reduces the number of parts required for a system. However, custom logic devices require significantly greater engineering time and effort, which increases the cost to develop these circuits and may also delay the production of the end system.

A less expensive alternative to custom logic is the "programmable logic array." Programmable logic arrays take advantage of the fact that complex combinational logic functions can be reduced and simplified into various standard forms. For example, logical functions can be manipulated and reduced down to traditional Sum of Products (SOP) form. In SOP form, a logical function uses just two types of logic functions that are implemented sequentially. This is referred to as two-level logic and can be implemented with various conventional logic functions, e.g., AND-OR, NAND—NAND, NOR—NOR.

One benefit of the programmable logic array is that it provides a regular, systematic approach to the design of random, combinational logic circuits. A multitude of logical functions can be created from a common building block, e.g., an array of transistors. The logic array is customized or "programmed" by creating a specific metallization pattern to interconnect the various transistors in the array to implement the desired function.

Programmable logic arrays are fabricated using photolithographic techniques that allow semiconductor and other materials to be manipulated to form integrated circuits as is known in the art. These photolithographic techniques essentially use light that is focused through lenses and masks to define patterns in the materials with microscopic dimensions. The equipment and techniques that are used to implement this photolithography provide a limit for the size of the circuits that can be formed with the materials. Essentially, at some point, the lithography cannot create a fine enough image with sufficient clarity to decrease the size of the elements of the circuit. In other words, there is a minimum dimension that can be achieved through conventional photolithography. This minimum dimension is referred to as the "critical dimension" (CD) or minimum "feature size" (F) of the photolithographic process. The minimum feature size imposes one constraint on the size of the components of a programmable logic array. In order to keep up with the demands for larger programmable logic arrays, designers search for ways to reduce the size of the components of the array.

As the density requirements become higher and higher in logic and memories it becomes more and more crucial to minimize device area. The programmable logic array (PLA) circuit in the NOR—NOR configuration is one example of an architecture for implementing logic circuits.

The continuous scaling, however, of MOSFET technology to the deep sub-micron region where channel lengths are less than 0.1 micron, 100 nm, or 1000 A causes significant problems in the conventional transistor structures. As shown in FIG. 1, junction depths should be much less than the channel length of 1000 A, or this implies junction depths of a few hundred Angstroms. Such shallow junctions are difficult to form by conventional implantation and diffusion techniques. Extremely high levels of channel doping are required to suppress short-channel effects such as drain-induced barrier lowering, threshold voltage roll off, and sub-threshold conduction. Sub-threshold conduction is particularly problematic in DRAM technology as it reduces the charge storage retention time on the capacitor cells. These extremely high doping levels result in increased leakage and reduced carrier mobility. Thus making the channel shorter to improve performance is negated by lower carrier mobility.

For the reasons stated above, and for other reasons stated below which will become apparent to those skilled in the art upon reading and understanding the present specification, there is a need in the art for a programmable logic array that uses less surface area of a semiconductor wafer as compared to conventional decoder arrays.

SUMMARY OF THE INVENTION

The above mentioned problems with programmable logic arrays and other problems are addressed by the present invention and will be understood by reading and studying the following specification. A circuit and method for a programmable logic array using ultra thin body vertical transistors is provided.

In particular, one embodiment of the present invention includes a programmable logic array having a first logic plane and a second logic plane. The first logic plane receives a number of input signals. The first logic plane has a plurality of logic cells arranged in rows and columns that are interconnected to provide a number of logical outputs. The second logic plane has a number of logic cells arranged in rows and columns that receive the outputs of the first logic plane and that are interconnected to produce a number of logical outputs such that the programmable logic array implements a logical function. Each of the logic cells includes a vertical pillar extending outwardly from a semiconductor substrate. Each pillar includes a single crystalline first contact layer and a second contact layer separated by an oxide layer. Each logic cell further includes at least one single crystalline ultra thin vertical transistor that is selectively disposed adjacent the vertical pillar. The single crystalline vertical transistors have an ultra thin single crystalline vertical first source/drain region coupled to the first contact layer, an ultra thin single crystalline vertical second source/drain region coupled to the second contact layer, and an ultra thin single crystalline vertical body region which opposes the oxide layer and couples the first and the second source/drain regions. The ultra thin single crystalline vertical transistors have a vertical length of less than 100 nanometers and a horizontal width of less than 10 nanometers.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE PREFERRED EMBODIMENTS

In the following detailed description of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art.

The illustrative embodiments described herein concern electrical circuitry which uses voltage levels to represent binary logic states—namely, a "high" logic level and a "low" logic level. Further, electronic signals used by the various embodiments of the present invention are generally considered active when they are high. However, a bar over the signal name in this application indicates that the signal is negative or inverse logic. Negative or inverse logic is considered active when the signal is low.

The term "horizontal" as used in this application is defined as a plane parallel to the conventional plane or surface of a wafer or substrate, regardless of the orientation of the wafer or the substrate. The term "vertical" refers to a direction perpendicular to the horizontal as defined above. Prepositions, such as "on," "side," (as in sidewall), "higher," "lower," "over," and "under" are defined with respect to the conventional plane or surface being on the top surface of the wafer or substrate, regardless of the orientation of the wafer or substrate. The following detailed description is not to be taken in a limiting sense, and the scope of the present invention is defined only by the appended claims.

Throughout this specification the designation "n+" refers to semiconductor material that is heavily doped n-type semiconductor material, e.g., monocrystalline silicon or polycrystalline silicon. Similarly, the designation "p+" refers to semiconductor material that is heavily doped p-type semiconductor material. The designations "n−" and "p−" refer to lightly doped n and p-type semiconductor materials, respectively.

Figure 1:
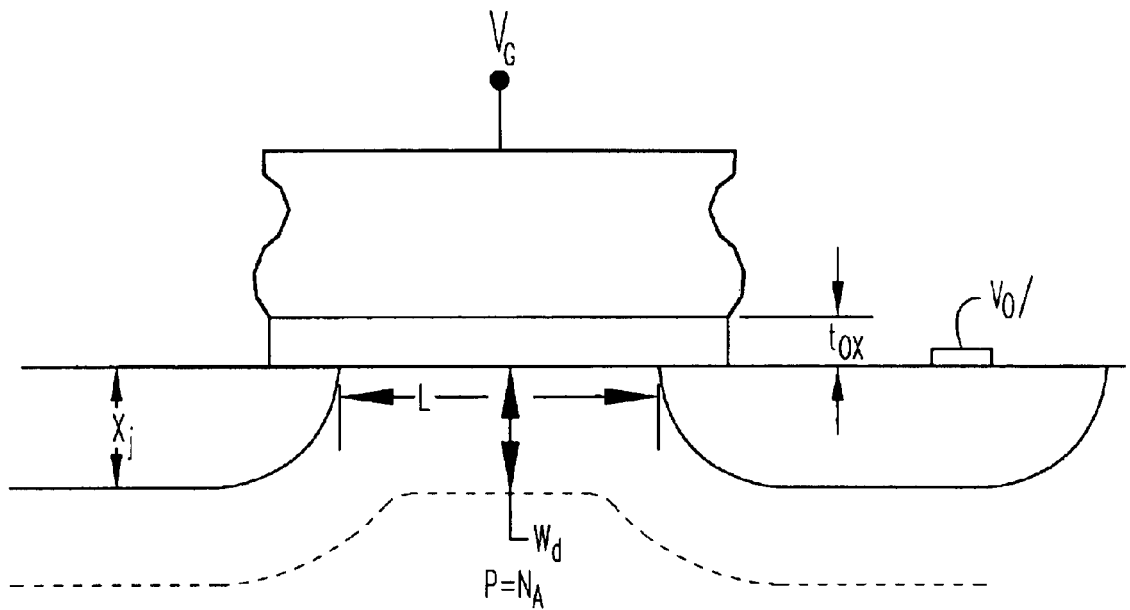
FIG. 1 is an illustration of a convention MOSFET transistor illustrating the shortcomings of such conventional MOSFETs as continuous scaling occurs to the deep submicron region where channel lengths are less than 0.1 micron, 100 nm, or 1000 A.
Figure 2:
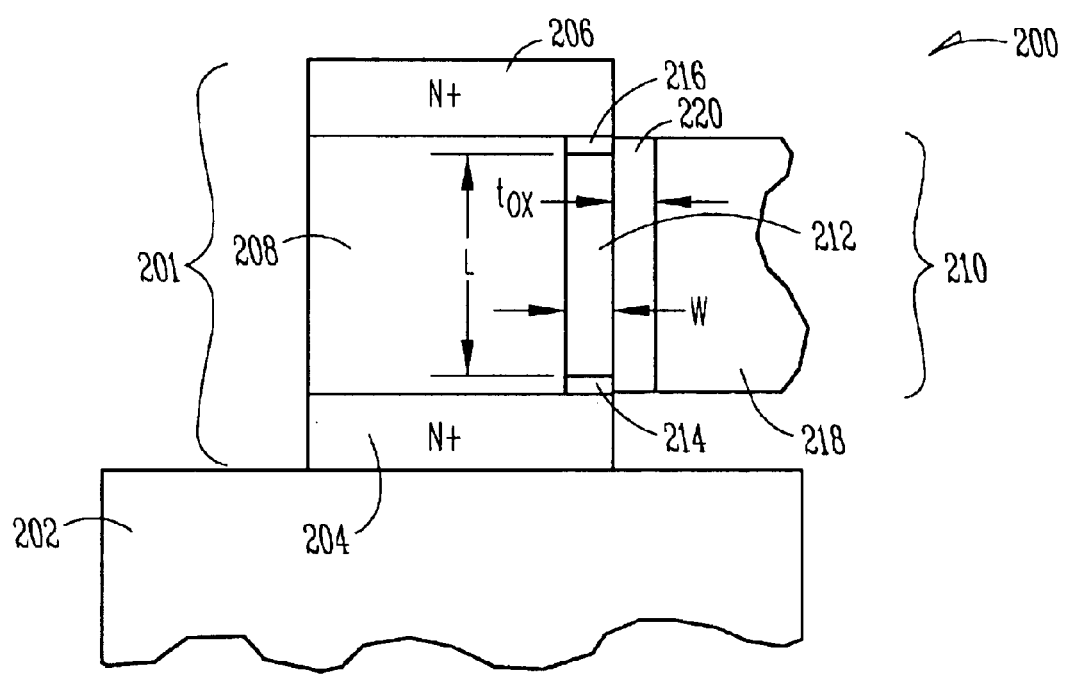
FIG. 2 is a diagram illustrating a vertical ultra thin body transistor formed along side of a pillar according to the teachings of the present invention.

FIG. 2 is a diagram illustrating an access FET 200 formed according to the teachings of the present invention which make up a portion of the programmable logic array. As shown in FIG. 2, access FET 200 includes a vertical ultra thin body transistor, or otherwise stated an ultra thin single crystalline vertical transistor. According to the teachings of the present invention, the structure of the access FET 200 includes a pillar 201 extending outwardly from a semiconductor substrate 202. The pillar includes a single crystalline first contact layer 204 and a single crystalline second contact layer 206 vertically separated by an oxide layer 208. An ultra thin single crystalline vertical transistor 210 is formed along side of the pillar 201. The ultra thin single crystalline vertical transistor 210 includes an ultra thin single crystalline vertical body region 212 which separates an ultra thin single crystalline vertical first source/drain region 214 and an ultra thin single crystalline vertical second source/drain region 216. A gate 218, which may be integrally formed with a word line as described above and below, is formed opposing the ultra thin single crystalline vertical body region 212 and is separated therefrom by a thin gate oxide layer 220.

According to embodiments of the present invention, the ultra thin single crystalline vertical transistor 210 includes a transistor having a vertical length of less than 100 nanometers and a horizontal width of less than 10 nanometers. Thus, in one embodiment, the ultra thin single crystalline vertical body region 212 includes a channel having a vertical length (L) of less than 100 nanometers. Also, the ultra thin single crystalline vertical body region 212 has a horizontal width (W) of less than 10 nanometers. And, the ultra thin single crystalline vertical first source/drain region 214 and an ultra thin single crystalline vertical second source/drain region 216 have a horizontal width of less than 10 nanometers. According to the teachings of the present invention, the ultra thin single crystalline vertical transistor 210 is formed from solid phase epitaxial growth.

An n-channel type transistor is shown in the embodiment of FIG. 2. However, one of ordinary skill in the art will further understand upon reading this disclosure that the conductivity types described herein can be reversed by altering doping types such that the present invention is equally applicable to include structures having ultra thin vertically oriented single crystalline p-channel type transistors. The invention is not so limited.

Figure 3A:
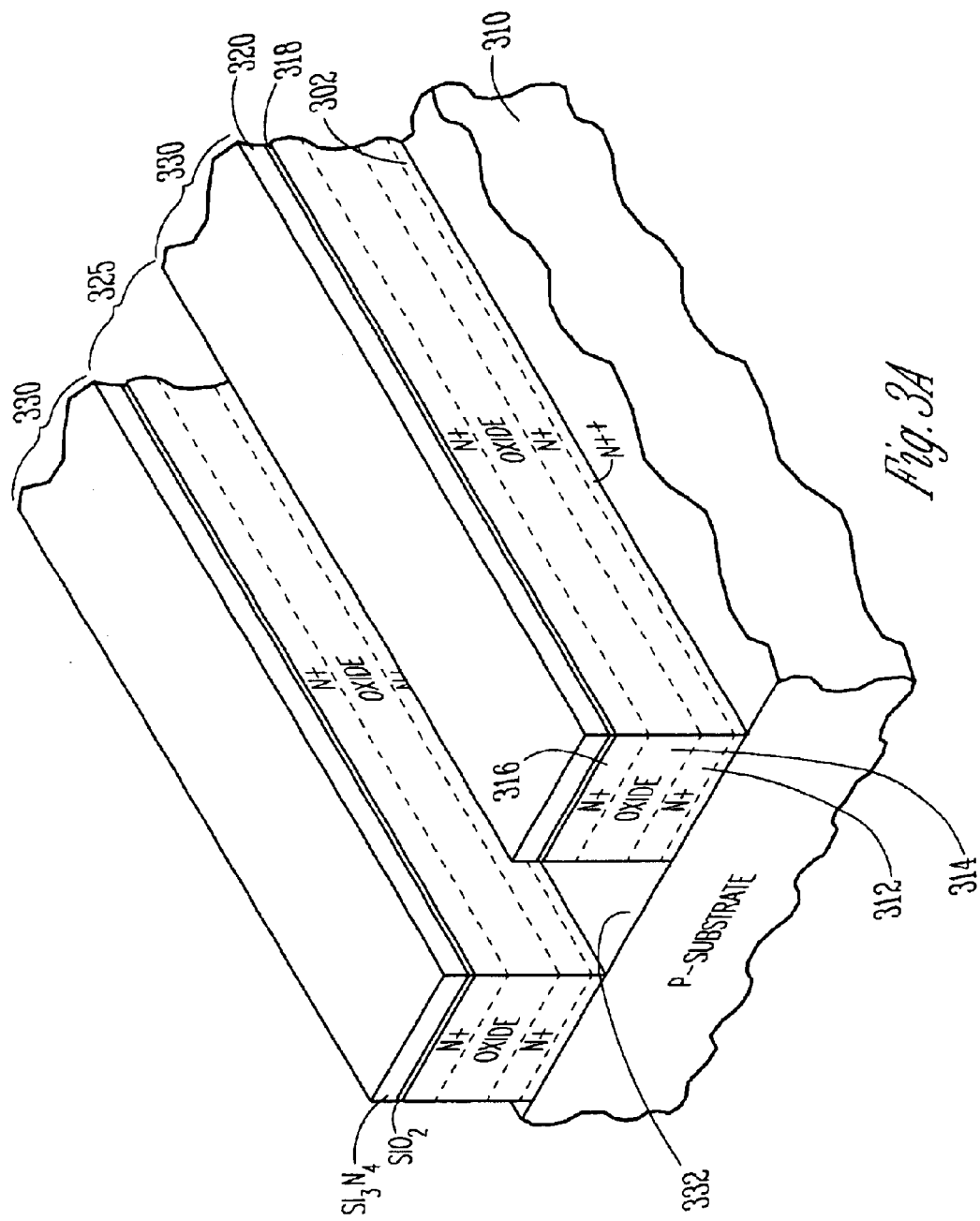
FIGS. 3A–3C illustrate an initial process sequence for forming pillars along side of which vertical ultra thin body transistors can later be formed according to the teachings of the present invention.
Figure 3B:
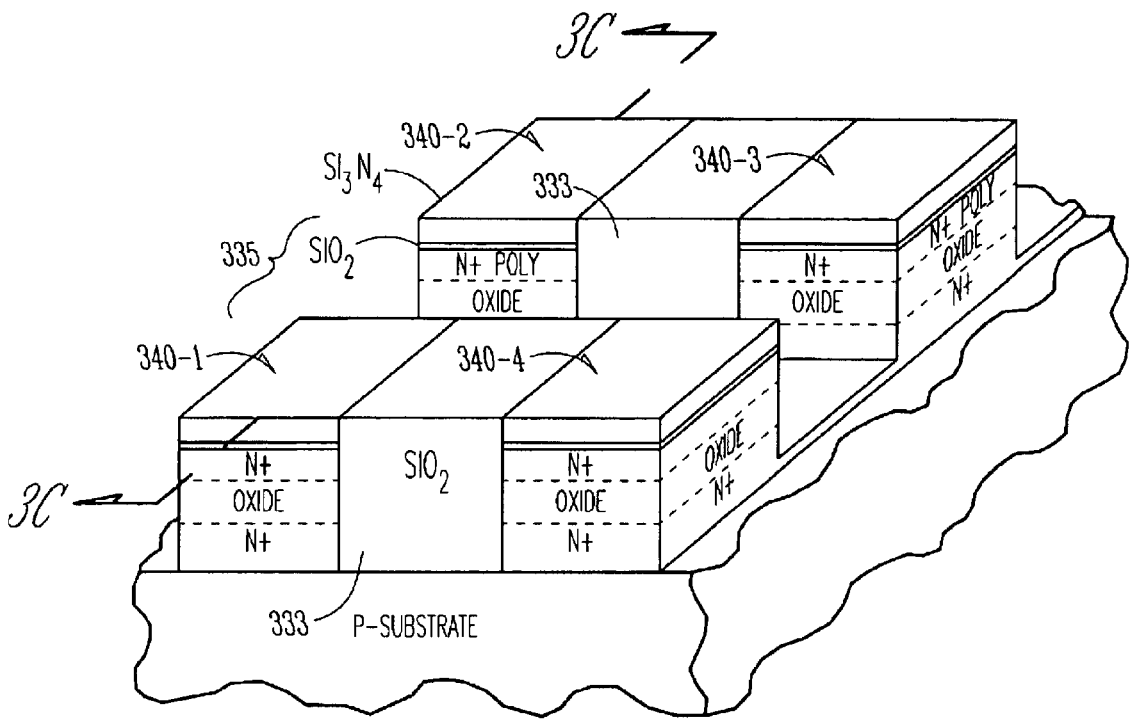
Figure 3C:
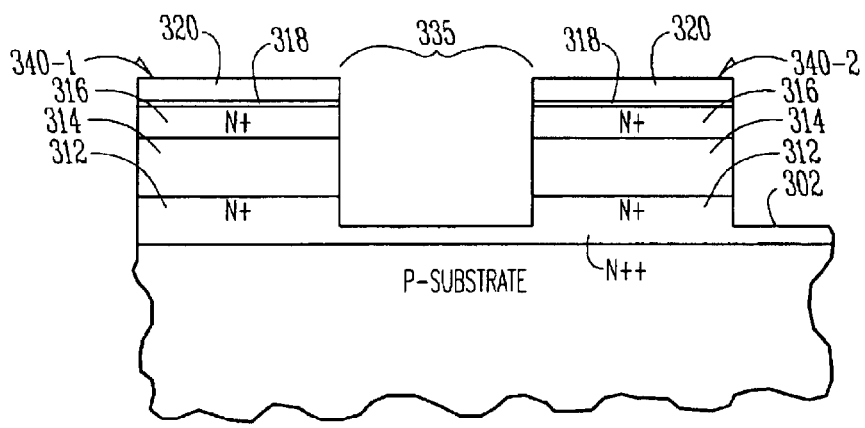

FIGS. 3A–3C illustrate an initial process sequence for forming pillars along side of which vertical ultra thin body transistors can later be formed as part of forming a programmable logic array according to the teachings of the present invention. The dimensions suggested are appropriate to a 0.1 µm cell dimension (CD) technology and may be scaled accordingly for other CD sizes. In the embodiment of FIG. 3A, a p-type bulk silicon substrate 310 starting material is used. An n++ and n+ silicon composite first contact layer 312 is formed on substrate 310, such as by ion-implantation, epitaxial growth, or a combination of such techniques to form a single crystalline first contact layer 312. According to the teachings of the present invention, the more heavily conductively doped lower portion of the first contact layer 312 also functions as the bit line 302. The thickness of the n++ portion of first contact layer 312 is that of the desired bit line 302 thickness, which can be approximately between 0.1 to 0.25 µm. The overall thickness of the first contact layer 312 can be approximately between 0.2 to 0.5 µm. An oxide layer 314 of approximately 100 nanometers (nm), 0.1 µm, thickness or less is formed on the first contact layer 312. In one embodiment, the oxide layer 314 can be formed by thermal oxide growth techniques. A second contact layer 316 of n+ silicon is formed on the oxide layer 314, using know techniques to form a polycrystalline second contact layer 316. The second contact layer 316 is formed to a thickness of 100 m or less.

Next, a thin silicon dioxide layer ($SiO_2$) 318 of approximately 10 nm is deposited on the second contact layer 316. A thicker silicon nitride layer ($Si_3N_4$) 320 of approximately 100 nm in thickness is deposited on the thin silicon dioxide layer ($SiO_2$) 318 to form pad layers, e.g. layers 318 and 320. These pad layers 318 and 320 can be deposited using any suitable technique such as by chemical vapor deposition (CVD).

A photoresist is applied and selectively exposed to provide a mask for the directional etching of trenches 325, such as by reactive ion etching (RIE). The directional etching results in a plurality of column bars 330 containing the stack of nitride layer 320, pad oxide layer 318, second contact layer 316, oxide layer 314, and first contact layer 312. Trenches 325 are etched to a depth that is sufficient to reach the surface 332 of substrate 310, thereby providing separation between conductively doped bit lines 302. The photoresist is removed. Bars 330 are now oriented in the direction of bit lines 302, e.g. column direction. In one embodiment, bars 330 have a surface line width of approximately 0.1 micron or less. The width of each trench 325 can be approximately equal to the line width of bars 330. The structure is now as appears in FIG. 3A.

In FIG. 3B, isolation material 333, such as $SiO_2$ is deposited to fill the trenches 325. The working surface is then planarized, such as by chemical mechanical polishing/planarization (CMP). A second photoresist is applied and selectively exposed to provide a mask for the directional etching of trenches 335 orthogonal to the bit line 302 direction, e.g. row direction. Trenches 335 can be formed using any suitable technique such as by reactive ion etching (RIE). Trenches 335 are etched through the exposed $SiO_2$ and the exposed stack of nitride layer 320, pad oxide layer 318, second contact layer 316, oxide layer 314, and into the first contact layer 312 but only to a depth sufficient to leave the desired bit line 302 thickness, e.g. a remaining bit line thickness of typically 100 nm. The structure is now as appears in FIG. 3B having individually defined pillars 340-1, 340-2, 340-3, and 340-4.

FIG. 3C illustrates a cross sectional view of the structure shown in FIG. 3B taken along cut-line 3C—3C. FIG. 3C shows the continuous bit line 302 connecting adjacent pillars 340-1 and 340-2 in any given column. Trench 335 remains for the subsequent formation of wordlines, as described below, in between adjacent rows of the pillars, such as a row formed by pillars 340-1 and 340-4 and a row formed by pillars 340-2, and 340-3.

Figure 4A:
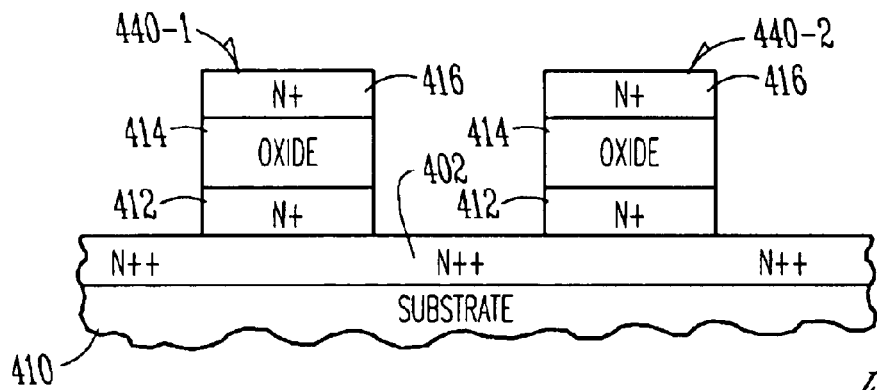
FIGS. 4A–4C illustrate that the above techniques described in connection with FIGS. 3A–3C can be implemented with a bulk CMOS technology or a silicon on insulator (SOI) technology.
Figure 4B:
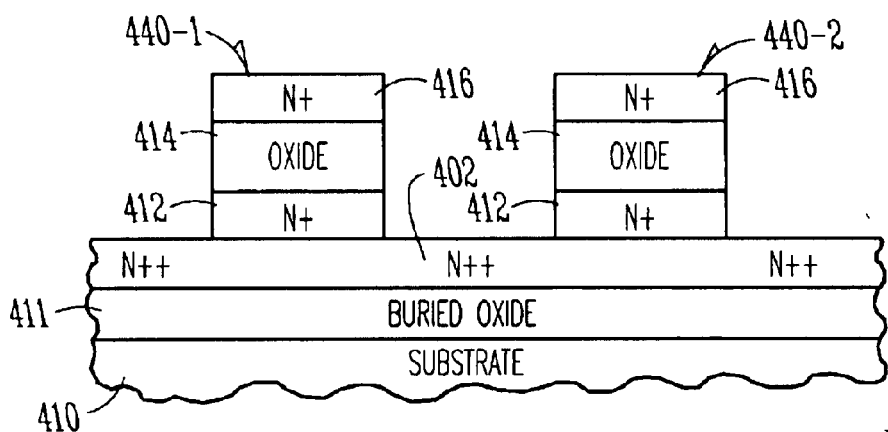
Figure 4C:
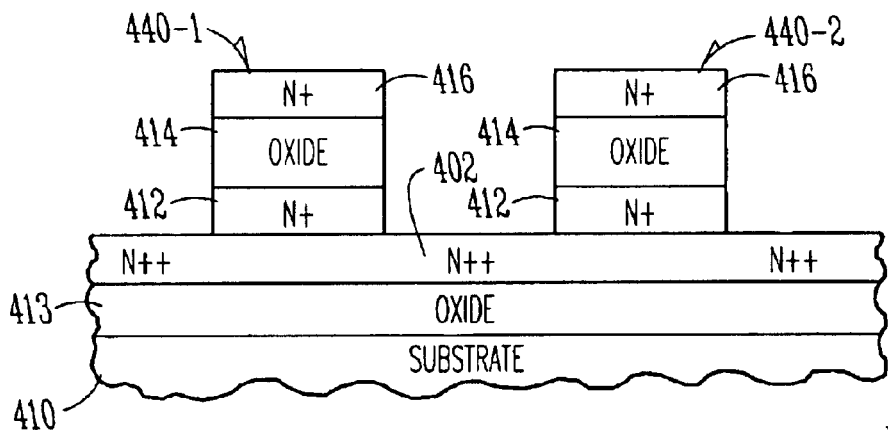

FIGS. 4A–4C illustrate that the above techniques described in connection with FIGS. 3A–3C can be implemented on a bulk CMOS technology substrate or a silicon on insulator (SOI) technology substrate. FIG. 4A represents the completed sequence of process steps shown in FIGS. 3A–3C, minus the pad layers, formed on a lightly doped p-type bulk silicon substrate 410. The structure shown in FIG. 4A is similar to the cross sectional view in FIG. 3C and shows a continuous bit line 402 with pillar stacks 440-1 and 440-2 formed thereon. The pillars 440-1 and 440-2 include an n+ first contact layer 412, an oxide layer 414 formed thereon, and a second n+ contact layer 416 formed on the oxide layer 414.

FIG. 4B represents the completed sequence of process steps shown in FIGS. 3A–3C, minus the pad layers, formed on a commercial SOI wafer, such as SIMOX. As shown in FIG. 4B, a buried oxide layer 411 is present on the surface of the substrate 410. The structure shown in FIG. 4B is also similar to the cross sectional view in FIG. 3C and shows a continuous bit line 402 with pillar stacks 440-1 and 440-2 formed thereon, only here the continuous bit line 402 is separated from the substrate 410 by the buried oxide layer 411. Again, the pillars 440-1 and 440-2 include an n+ first contact layer 412, an oxide layer 414 formed thereon, and a second n+ contact layer 416 formed on the oxide layer 414.

FIG. 4C represents the completed sequence of process steps shown in FIGS. 3A–3C, minus the pad layers, forming islands of silicon on an insulator, where the insulator 413 has been formed by oxide under cuts. Such a process includes the process described in more detail in U.S. Pat. No. 5,691,230, by Leonard Forbes, entitled "Technique for Producing Small Islands of Silicon on Insulator," issued Nov. 25, 1997, which is incorporated herein by reference. The structure shown in FIG. 4C is also similar to the cross sectional view in FIG. 3C and shows a continuous bit line 402 with pillar stacks 440-1 and 440-2 formed thereon, only here the continous bit line 402 is separated from the substrate 410 by the insulator 413 which has been formed by oxide under cuts such as according to the process referenced above. Again, the pillars 440-1 and 440-2 include an n+ first contact layer 412, an oxide layer 414 formed thereon, and a second n+ contact layer 416 formed on the oxide layer 414. Thus, according to the teachings of the present invention, the sequence of process steps to form pillars, as shown in FIGS. 3A–3C, can include forming the same on at least three different types of substrates as shown in FIGS. 4A–4C.

Figure 5A:
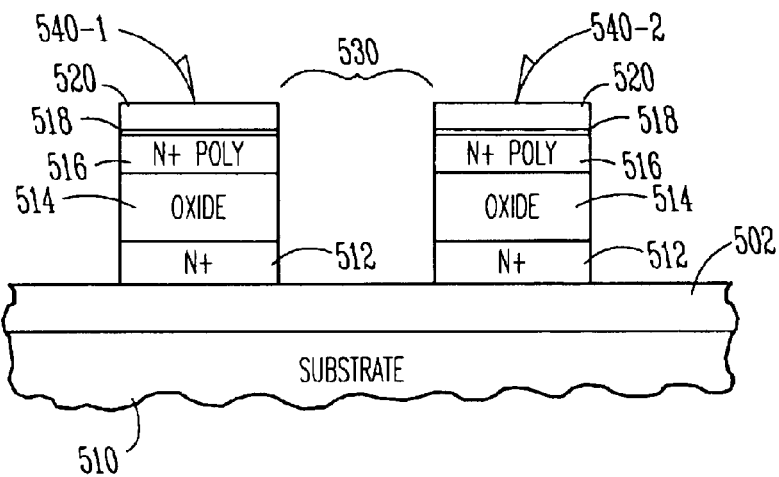
FIGS. 5A–5D illustrate a process sequence continuing from the pillar formation embodiments provided in FIGS. 3A–4C to form vertical ultra thin body transistors along side of the pillars.
Figure 5B:
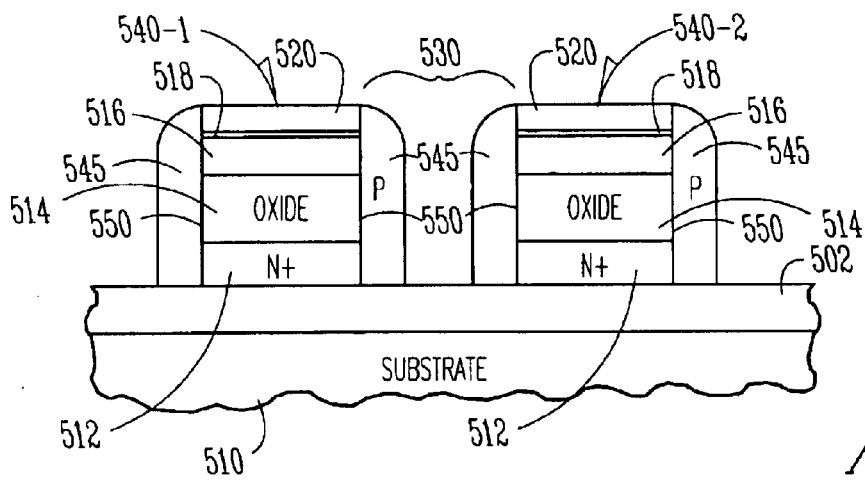
Figure 5C:
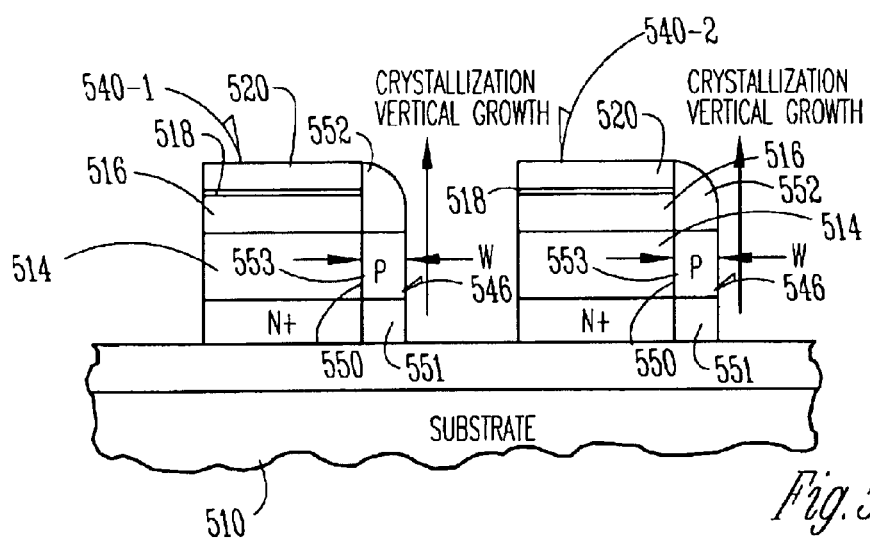

FIGS. 5A–5C illustrate a process sequence continuing from the pillar formation embodiments provided in FIGS. 3A–3C, and any of the substrates shown in FIGS. 4A–4C, to form vertical ultra thin body transistors along side of the pillars, such as pillars 340-1 and 340-2 in FIG. 3C. For purposes of illustration only, FIG. 5A illustrates an embodiment pillars 540-1 and 540-2 formed on a p-type substrate 510 and separated by a trench 530. Analogous to the description provided in connection FIGS. 5A–5C, FIG. 5A shows a first single crystalline n+ contact layer 512 a portion of which, in one embodiment, is integrally formed with an n++ bit line 502. An oxide layer region 514 is formed in pillars 540-1 and 540-2 on the first contact layer 512. A second n+ contact layer 516 is shown formed on the oxide layer region 514 in the pillars 540-1 and 540-2. And, pad layers of ($SiO_2$) 518 and ($Si_3N_4$) 520, respectively are shown formed on the second contact layer 516 in the pillars 540-1 and 540-2.

In FIG. 5B, a lightly doped p-type polysilicon layer 545 is deposited over the pillars 540-1 and 540-2 and directionally etched to leave the lightly doped p-type material 545 on the sidewalls 550 of the pillars 540-1 and 540-2. In one embodiment according to the teachings of the present invention, the lightly doped p-type polysilicon layer is directionally etched to leave the lightly doped p-type material 545 on the sidewalls 550 of the pillars 540-1 and 540-2 having a width (W), or horizontal thickness of 10 nm or less. The structure is now as shown in FIG. 5B.

The next sequence of process steps is described in connection with FIG. 5C. At this point another masking step, as the same has been described above, can be employed to isotropically etch the polysilicon 545 off of some of the sidewalls 550 and leave polysilicon 545 only on one sidewall of the pillars 540-1 and 540-2 if this is required by some particular configuration, e.g. forming ultra thin body transistors only on one side of pillars 540-1 and 540-2.

In FIG. 5C, the embodiment for forming the ultra thin single crystalline vertical transistors, or ultra thin body transistors, only on one side of pillars 540-1 and 540-2 is shown. In FIG. 5C, the wafer is heated at approximately 550 to 700 degrees Celsius. In this step, the polysilicon 545 will recrystallize and lateral epitaxial solid phase regrowth will occur vertically. As shown in FIG. 5C, the single crystalline silicon at the bottom of the pillars 540-1 and 540-2 will seed this crystal growth and an ultrathin single crystalline film 546 will form which can be used as the channel of an ultra thin single crystalline vertical MOSFET transistor. In the embodiment of FIG. 5C, where the film is left only on one side of the pillar, the crystallization will proceed vertically and into the n+ polysilicon second contact material/layer 516 on top of the pillars 540-1 and 540-2. If however, both sides of the pillars 540-1 and 540-2 are covered, the crystallization will leave a grain boundary near the center on top of the pillars 540-1 and 540-2. This embodiment is shown in FIG. 5D.

Figure 5D:
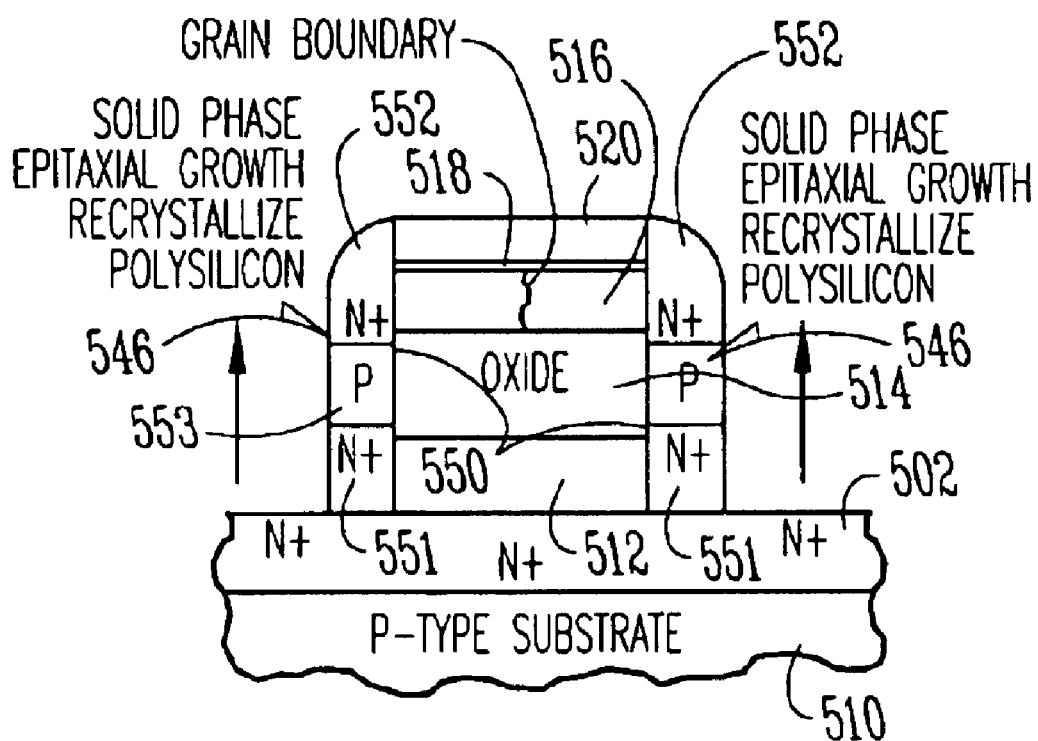

As shown in FIGS. 5C and 5D, drain and source regions, 551 and 552 respectively, will be formed in the ultrathin single crystalline film 546 along the sidewalls 550 of the pillars 540-1 and 540-2 in the annealing process by an out diffusion of the n+ doping from the first and the second contact layers, 512 and 516. In the annealing process, these portions of the ultrathin single crystalline film 546, now with the n+ dopant, will similarly recrystallize into single crystalline structure as the lateral epitaxial solid phase regrowth occurs vertically. The drain and source regions, 551 and 552, will be separated by a vertical single crystalline body region 553 formed of the p-type material. In one embodiment of the present invention, the vertical single crystalline body region will have a vertical length of less than 100 nm. The structure is now as shown in FIG. 5C or 5D. As one of ordinary skill in the art will understand upon reading this disclosure. A conventional gate insulator can be grown or deposited on this ultrathin single crystalline film 546. And, either horizontal or vertical gate structures can be formed in trenches 530.

As one of ordinary skill in the art will understand upon reading this disclosure, drain and source regions, 551 and 552 respectively, have been formed in an ultrathin single crystalline film 546 to form a portion of the ultra thin single crystalline vertical transistors, or ultra thin body transistors, according to the teachings of the present invention. The ultrathin single crystalline film 546 now includes an ultra thin single crystalline vertical first source/drain region 551 coupled to the first contact layer 512 and an ultra thin single crystalline vertical second source/drain region 552 coupled to the second contact layer 516. An ultra thin p-type single crystalline vertical body region 553 remains along side of, or opposite, the oxide layer 514 and couples the first source/drain region 551 to the second source/drain region 552. In effect, the ultra thin p-type single crystalline vertical body region 553 separates the drain and source regions, 551 and 552 respectively, and can electrically couple the drain and source regions, 551 and 552, when a channel is formed therein by an applied potential. The drain and source regions, 551 and 552 respectively, and the ultra thin body region 553 are formed of single crystalline material by the lateral solid phase epitaxial regrowth which occurs in the annealing step.

The dimensions of the structure now include an ultra thin single crystalline body region 553 having a vertical length of less than 100 nm in which a channel having a vertical length of less than 100 nm can be formed. Also, the dimensions include drain and source regions, 551 and 552 respectively, having a junction depth defined by the horizontal thickness of the ultrathin single crystalline film 546, e.g. less than 10 nm. Thus, the invention has provided junction depths which are much less than the channel length of the device and which are scalable as design rules further shrink. Further, the invention has provided a structure for transistors with ultra thin bodies so that a surface space charge region in the body of the transistor scales down as other transistor dimensions scale down. In effect, the surface space charge region has been minimized by physically making the body region of the MOSFET ultra thin, e.g. 10 nm or less.

One of ordinary skill in the art will further understand upon reading this disclosure that the conductivity types described herein can be reversed by altering doping types such that the present invention is equally applicable to include structures having ultra thin vertically oriented single crystalline p-channel type transistors. The invention is not so limited. From the process descriptions described above, the fabrication process can continue to form a number of different horizontal and vertical gate structure embodiments in the trenches 530 as described in connection with the Figures below.

Figure 6A:
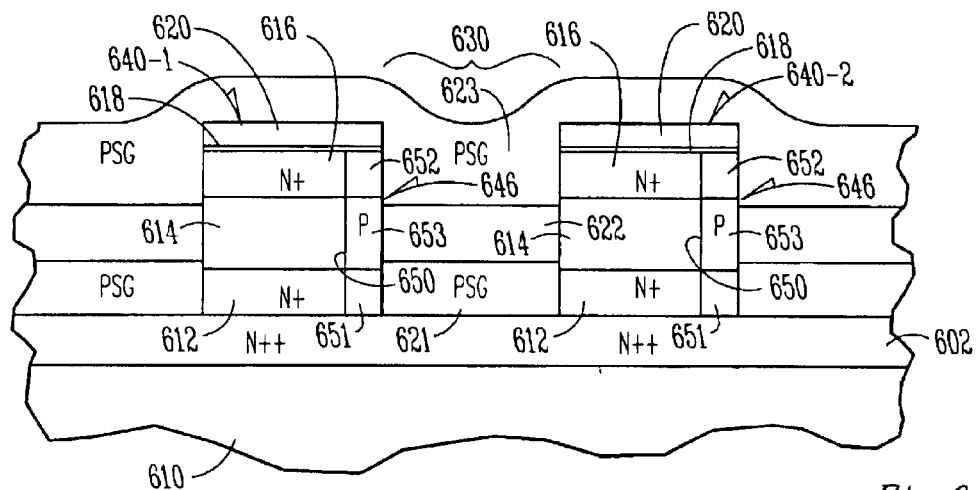
FIGS. 6A–6C illustrate a process sequence for forming a horizontal gate structure embodiment, referred to herein as horizontal replacement gates, in connection with the present invention.
Figure 6B:
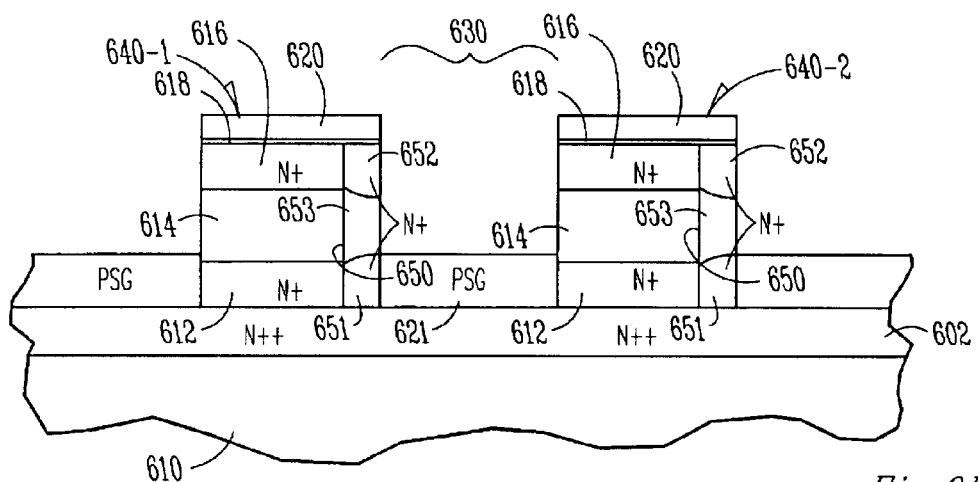
Figure 6C:
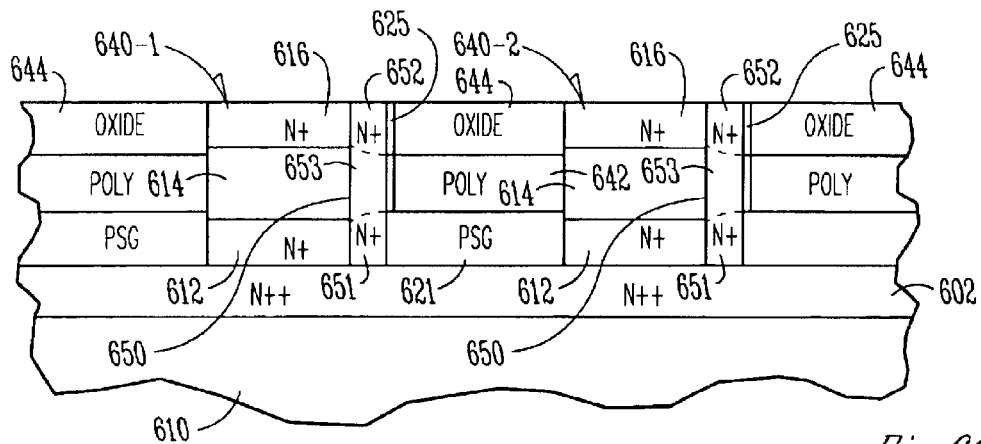

FIGS. 6A–6C illustrate a process sequence for forming a horizontal gate structure embodiment, referred to herein as horizontal replacement gates, in connection with the present invention. The dimensions suggested in the following process steps are appropriate to a 0.1 micrometer CD technology and may be scaled accordingly for other CD sizes. FIG. 6A represents a structure similar to that shown in FIG. 5C. That is FIG. 6A shows an ultrathin single crystalline film 646 along the sidewalls 650 of pillars 640-1 and 640-2 in trenches 630. The ultrathin single crystalline film 646 at this point includes an ultra thin single crystalline vertical first source/drain region 651 coupled to a first contact layer 612 and an ultra thin single crystalline vertical second source/drain region 652 coupled to a second contact layer 616. An ultra thin p-type single crystalline vertical body region 653 is present along side of, or opposite, an oxide layer 614 and couples the first source/drain region 651 to the second source/drain region 652. According to the process embodiment shown in FIG. 6A an n+ doped oxide layer 621, or PSG layer as the same will be known and understood by one of ordinary skill in the art will understand, is deposited over the pillars 640-1 and 640-2 such as by a CVD technique. This n+ doped oxide layer 621 is then planarized to remove off of the top surface of the pillars 640-1 and 640-2. An etch process is performed to leave about 50 nm at the bottom of trench 630. Next, an undoped polysilicon layer 622 or undoped oxide layer 622 is deposited over the pillars 640-1 and 640-2 and CMP planarized to again remove from the top surface of the pillars 640-1 and 640-2. Then, the undoped polysilicon layer 622 is etched, such as by RIE to leave a thickness of 100 nm or less in the trench 630 along side of, or opposite oxide layer 614. Next, another n+ doped oxide layer 623, or PSG layer as the same will be known and understood by one of ordinary skill in the art will understand, is deposited over the pillars 640-1 and 640-2 such as by a CVD process. The structure is now as appears in FIG. 6A.

FIG. 6B illustrates the structure following the next sequence of fabrication steps. In FIG. 6B, a heat treatment is applied to diffuse the n-type dopant out of the PSG layers, e.g. 621 and 623 respectively, into the vertical ultrathin single crystalline film 646 to additionally form the drain and source regions, 651 and 652 respectively. Next, as shown in FIG. 6B, a selective etch is performed, as the same will be known and understood by one of ordinary skill in the art upon reading this disclosure, to remove the top PSG layer 623 and the undoped polysilicon layer 622, or oxide layer 622 in the trench 630. The structure is now as appears in FIG. 6B.

Next, in FIG. 6C, a thin gate oxide 625 is grown as the same will be known and understood by one of ordinary skill in the art, such as by thermal oxidation, for the ultra thin single crystalline vertical transistors, or ultra thin body transistors on the surface of the ultra thin single crystalline vertical body region 653 for those transistors in alternating, row adjacent pillars which will be connected to trench conductor lines for completing the programmable logic array. Next, a doped n+ type polysilicon layer 642 can be deposited to form a gate 642 for the ultra thin single crystalline vertical transistors, or ultra thin body transistors. The structure then undergoes a CMP process to remove the doped n+ type polysilicon layer 642 from the top surface of the pillars 640-1 and 640-2 and RIE etched to form the desired thickness of the gate 642 for the ultra thin single crystalline vertical transistors, or ultra thin body transistors. In one embodiment, the doped n+ type polysilicon layer 642 is RIE etched to form an integrally formed, horizontally oriented word line/gate having a vertical side of less than 100 nanometers opposing the ultra thin single crystalline vertical body region 653. Next, an oxide layer 644 is deposited such as by a CVD process and planarized by a CMP process to fill trenches 630. An etch process is performed, as according to the techniques described above to strip the nitride layer 620 from the structure. This can include a phosphoric etch process using phosphoric acid. The structure is now as appears as is shown in FIG. 6C.

As one of ordinary skill in the art will understand upon reading this disclosure, contacts can be formed to the second contact layer 616 on top of the pillars 640-1 and 640-2 to continue with capacitor formation and standard BEOL processes.

Figure 7A:
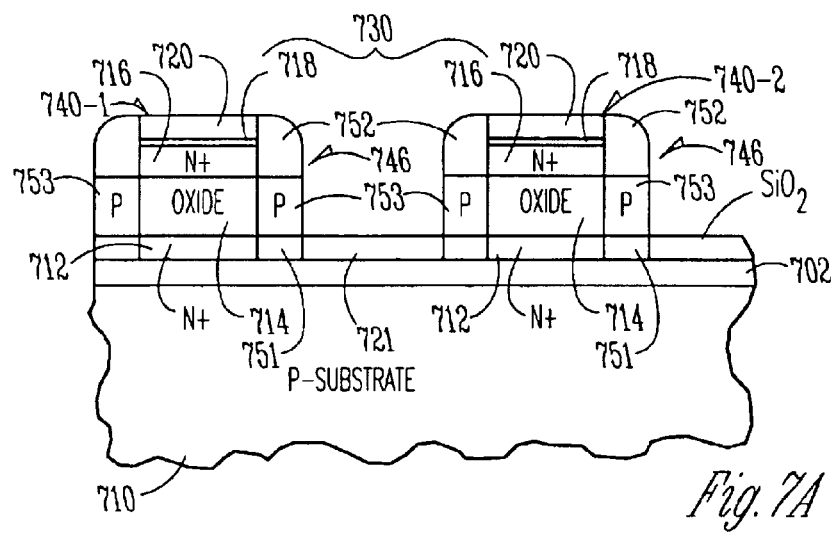
FIGS. 7A–7D illustrate a process sequence for forming a vertical gate structure embodiment, in connection with the present invention.

FIGS. 7A–7D illustrate a process sequence for forming a vertical gate structure embodiment according to the teachings of the present invention. The dimensions suggested in the following process steps are appropriate to a 0.1 micrometer CD technology and may be scaled accordingly for other CD sizes. FIG. 7A represents a structure similar to that shown in FIG. 5C. That is FIG. 7A shows an ultrathin single crystalline film 746 along the sidewalls 750 of pillars 740-1 and 740-2 in trenches 730. The ultrathin single crystalline film 746 at this point includes an ultra thin single crystalline vertical first source/drain region 751 coupled to a first contact layer 712 and an ultra thin single crystalline vertical second source/drain region 752 coupled to a second contact layer 716. An ultra thin p-type single crystalline vertical body region 753 is present along side of, or opposite, an oxide layer 714 and couples the first source/drain region 751 to the second source/drain region 752. According to the process embodiment shown in FIG. 7A, a conformal nitride layer of approximately 20 nm is deposited, such as by CVD, and directionally etched to leave only on the sidewalls 750. A oxide layer is then grown, such as by thermal oxidation, to a thickness of approximately 50 nm in order to insulate the exposed bit line bars 702. The conformal nitride layer on the sidewalls 750 prevents oxidation along the ultrathin single crystalline film 746. The nitride layer is then stripped, using conventional stripping processes as the same will be known and understood by one of ordinary skill in the art. The structure is now as appears in FIG. 7A.

Figure 7B:
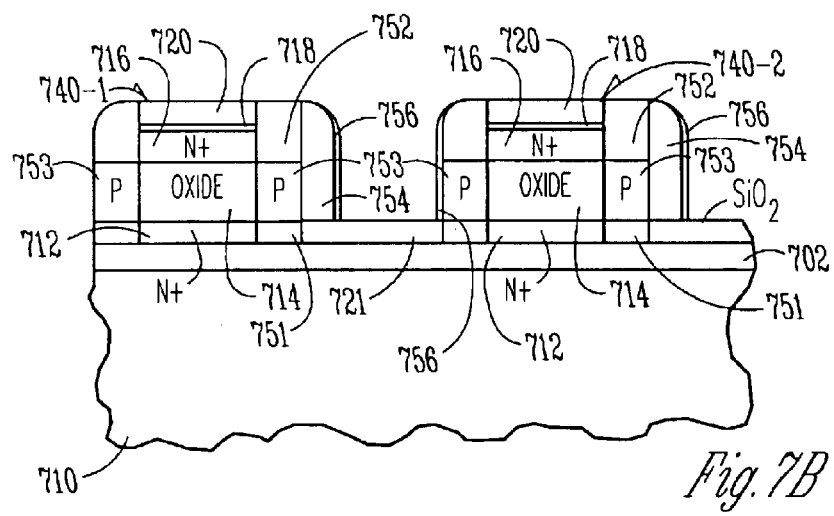

As shown in FIG. 7B, an intrinsic polysilicon layer 754 is deposited over the pillars 740-1 and 740-2 and in trenches 730 and then directionally etched to leave the intrinsic polysilicon layer 754 only on the vertical sidewalls of the pillars 740-1 and 740-2. A photoresist is applied and masked to expose pillar sides where device channels are to be formed, e.g. integrally formed wordline/gates on alternating, row adjacent pillars. In these locations, the intrinsic polysilicon layer 754 is selectively etched, as the same will be known and understood by one of ordinary skill in the art, to remove the exposed intrinsic polysilicon layer 754. Next, a thin gate oxide layer 756 is grown on the exposed sidewalls of the ultrathin single crystalline film 746 for the ultra thin single crystalline vertical transistors, or ultra thin body transistors. The structure is now as appears in FIG. 7B.

Figure 7C:
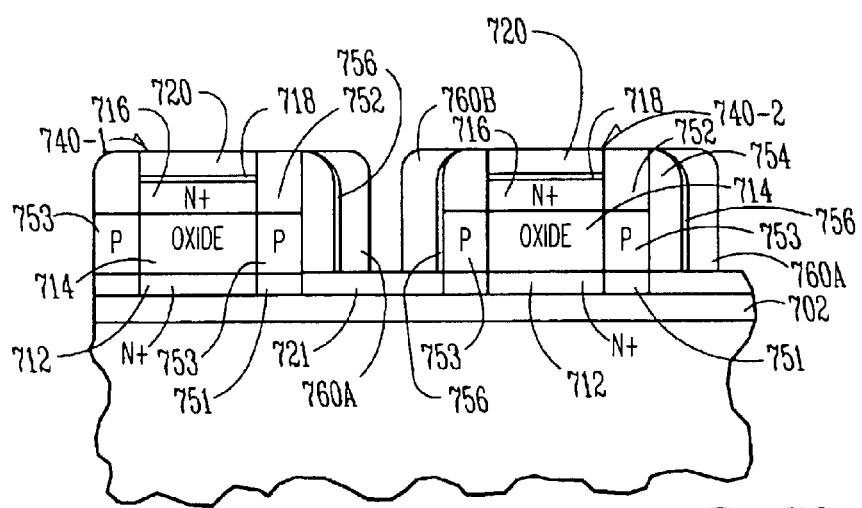

In FIG. 7C, a wordline conductor of an n+ doped polysilicon material or suitable metal 750 is deposited, such as by CVD, to a thickness of approximately 50 nm or less. This wordline conductor 750 is then directionally etched to leave only on the vertical sidewalls of the pillars, including on the thin gate oxide layers 756 of alternating, row adjacent pillars in order to form separate vertical, integrally formed wordline/gates 760A and 760B. The structure is now as appears in FIG. 7C.

Figure 7D:
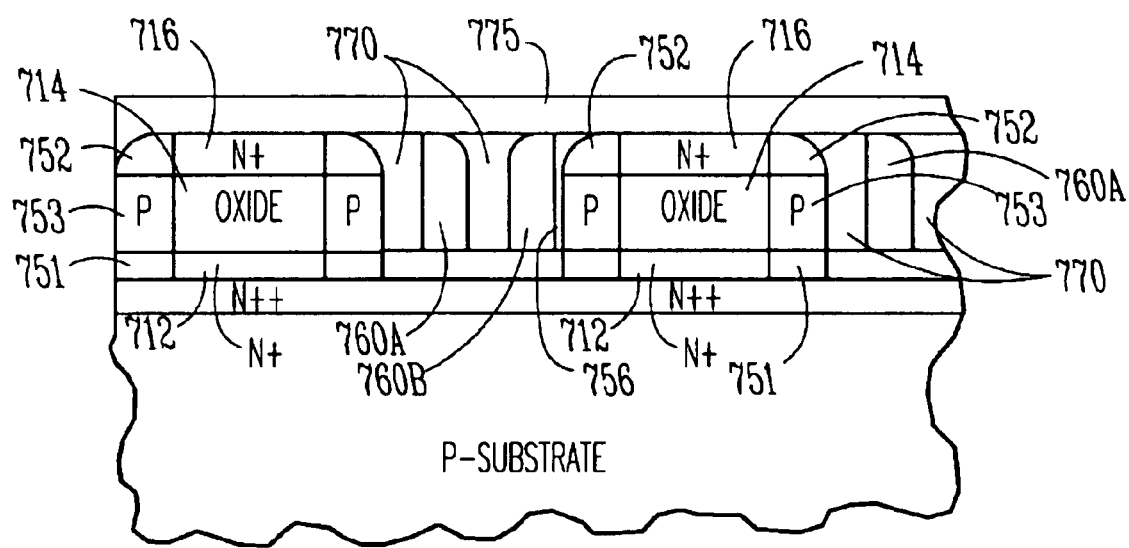

In FIG. 7D, a brief oxide etch is performed to expose the top of the remaining intrinsic polysilicon layer 754. Then, a selective isotropic etch is performed, as the same will be known and understood by one of ordinary skill in the art, in order to remove all of the remaining intrinsic polysilicon layer 754. An oxide layer 770 is deposited, such as by CVD, in order to fill the cavities left by removal of the intrinsic polysilicon layer and the spaces in the trenches 730 between the separate vertical wordlines 760A and 760B neighboring pillars 740-1 and 740-2. As mentioned above, the separate vertical wordlines will integrally form gates on alternating, row adjacent pillars. The oxide layer 770 is planarized by CMP to remove from the top of the pillars 740-1 and 740-2 stopping on the nitride pad 720. Then the remaining pad material 718 and 720 is etched, such as by RIE, to remove from the top of the pillars 740-1 and 740-2. Next, deposit CVD oxide 775 to cover the surface of the pillars 740-1 and 740-2. The structure is now as appears in FIG. 7D.

As one of ordinary skill in the art will understand upon reading this disclosure, the process can now proceed with storage capacitor formation and BEOL process steps.

As one of ordinary skill in the art will understand upon reading this disclosure, the process steps described above produce integrally formed vertically oriented wordlines 760A and 760B which serve as integrally formed vertical gates along the sides of alternating, row adjacent pillars.

Figure 8:
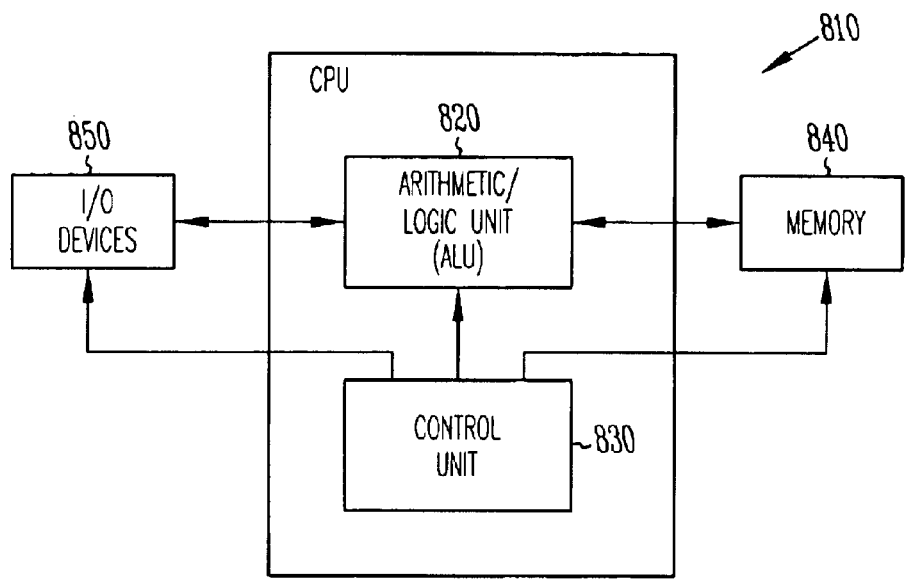
FIG. 8 is a block diagram of a high-level organization of a digital computer including one or more programmable logic arrays formed with vertical ultra thin body transistor according to the teachings of the present invention.

FIG. 8 is a block diagram of a high-level organization of a digital computer 800. A digital computer 800 is a system whose functional elements consist of an arithmetic/logic unit (ALUs) 820, a control unit 830, a memory unit 840 and an input/output (I/O) device 850. Every computer system has a native set of instructions that specify operations to be performed on data by the ALU 820 and other interactions between the ALU 820, the memory unit 840 and the I/O devices 850. The memory units 840 contain the data plus a stored list of instructions.

The control unit 830 coordinates all operations of the ALU 820, the memory unit 840 and the I/O devices 850 by continuously cycling through a set of operations that cause instructions to be fetched from the memory unit 840 and executed. Many of the logic functions performed by these components can include a programmable logic array with ultra thin single crystalline vertical transistors according to the teachings of the present invention. With respect to the ALU 820, the control unit 830 and the I/O devices 850, arbitrary logic functions may be realized in the "sum-of-products" form. A logic function sum-of-products may be implemented using any of the equivalent two-level logic configurations: AND-OR, NAND—NAND, NOR-OR, OR-NOR, AND-NOR, NAND-AND or OR-AND.

Figure 9:
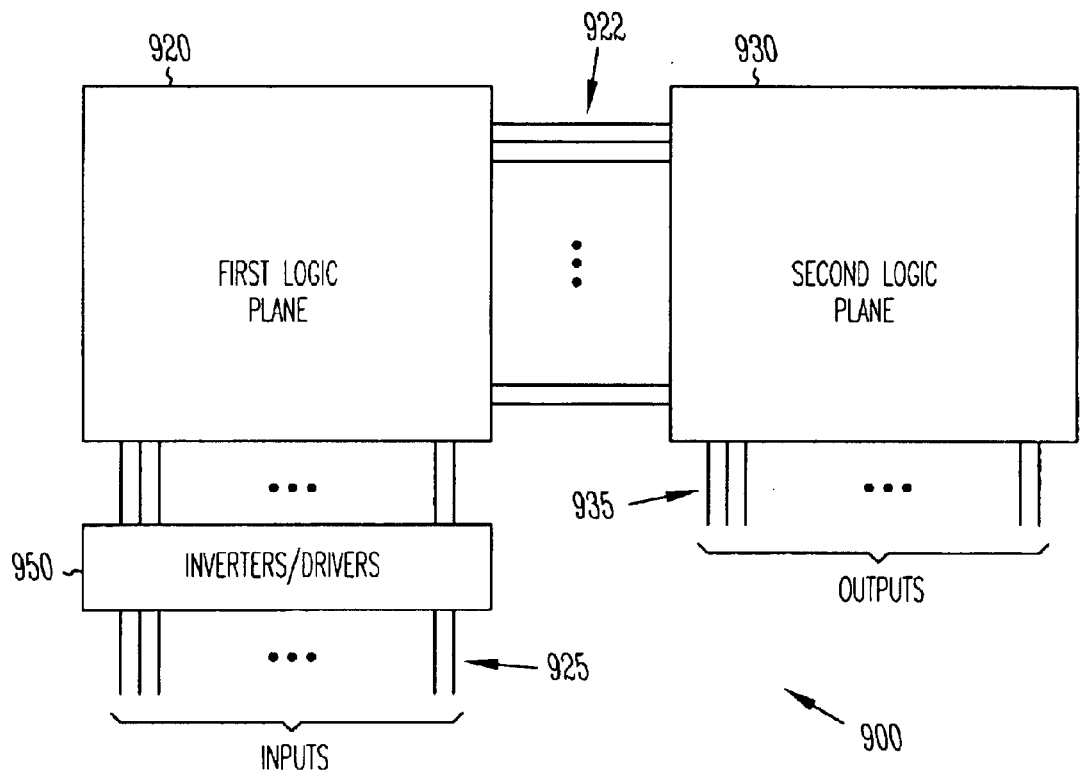
FIG. 9 is a block diagram of an embodiment of a programmable logic array according to the teachings of the present invention.

FIG. 9 is a diagram of a programmable logic array (PLA), indicated generally at 900, and constructed according to the teachings of the present invention. PLA 900 includes two major constituents: a first logic plane 920 and a second logic plane 930. The first and second logic planes 920 and 930 are formed using an array of vertical transistors. In one embodiment, the first and second logic planes 920 and 930 each comprise NOR logic circuits such that PLA 100 implements NOR—NOR logic. In other embodiments, first and second logic planes 920 and 930 are constructed from arrays of ultra thin single crystalline vertical transistors that are configured to implement AND-OR, OR-AND, NAND—NAND, NOR-OR, OR-NOR, AND-NOR, and NAND-AND logic.

Input lines 925 are coupled to receive a number of input signals. Inverters/drivers 950 are coupled to the input lines 925 such that first logic plane 920 is capable of receiving each of the input signals and their complements. First logic plane 920 produces a number of output signals that are logical combinations of the signals from inverters/drivers 950. The output signals from first logic plane 920 are provided to second logic plane 930 via interconnection lines 922. Second logic plane 930 produces a number of output signals that are logical combinations of the signals from interconnection lines 922.

In addition, various control circuits and signals not detailed herein initiate and synchronize the PLA 900 operation as known to those skilled in the art. The PLA 900 implementation described with respect to FIG. 9 is illustrative only and is not intended to be exclusive or limiting.

Figure 10:
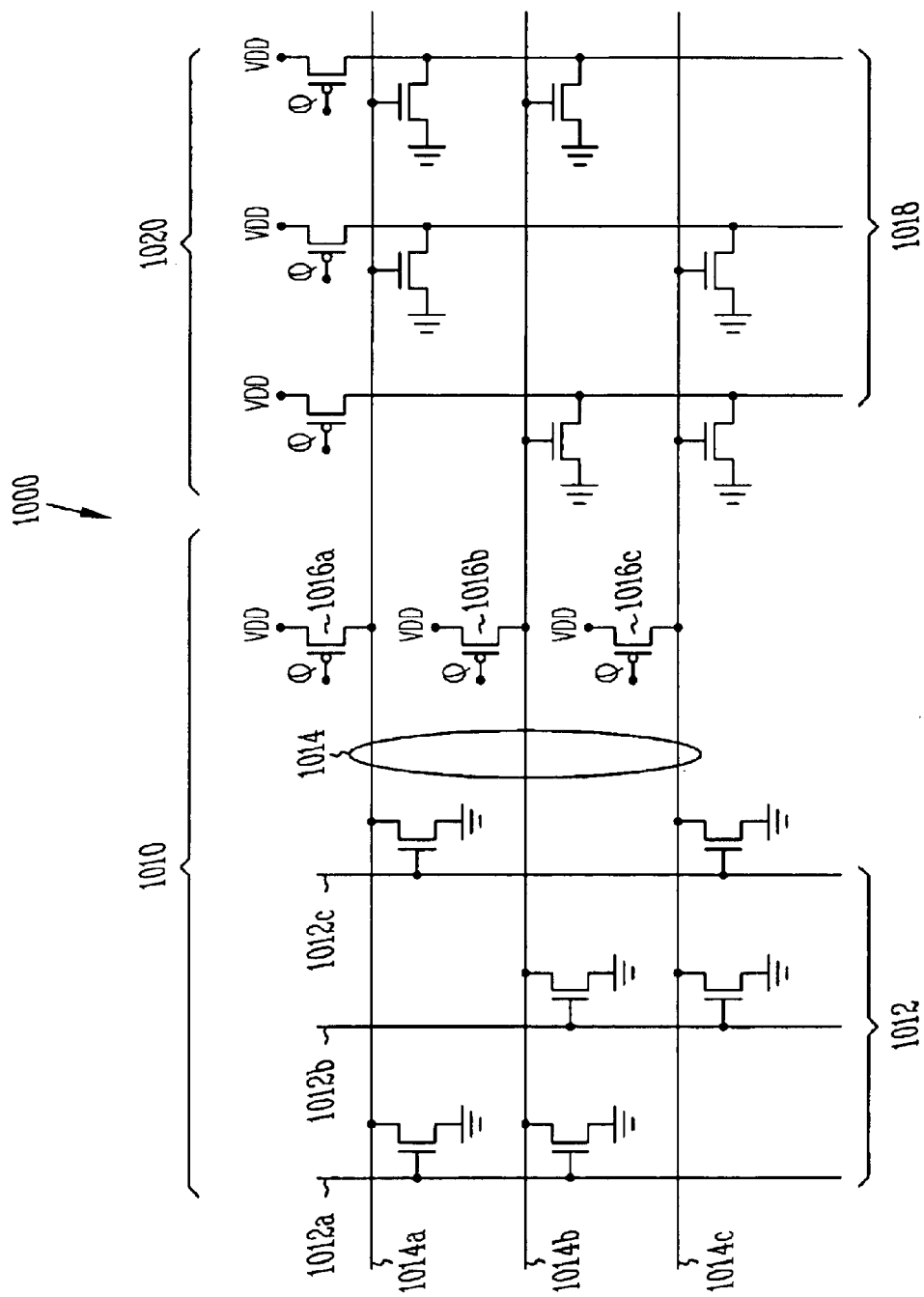
FIG. 10 is a schematic diagram illustrating generally an architecture of one embodiment of a programmable logic array according to the teachings of the present invention.

FIG. 10 is a schematic diagram illustrating generally an architecture of one embodiment of a programmable logic array (PLA), indicated generally at 1000, and constructed according to the teachings of the present invention. PLA 1000 implements an illustrative logical function using a two level logic approach. Specifically, PLA 1000 includes first and second logic planes 1010 and 1020. In this example, the logic function is implemented using NOR—NOR logic. First and second logic planes 1010 and 1020 each include an array of ultra thin single crystalline vertical transistors that are configured to implement the logical function of PLA 1000.

It is noted that the configuration of FIG. 10 is provided by way of example and not by way of limitation. Specifically, the teachings of the present application are not limited to programmable logic arrays in the NOR—NOR approach. Further, the teachings of the present application are not limited to the specific logical function shown in FIG. 10. Other logical functions can be implemented in a programmable logic array with ultra thin single crystalline vertical transistors using any one of the various two level logic approaches.

First logic plane 1010 receives a number of input signals at input lines 1012. In this example, no inverters are provided for generating complements of the input signals. However, first logic plane 1010 can include inverters to produce the complementary signals when needed in a specific application.

First logic plane 1010 includes a number of ultra thin single crystalline vertical transistors that form an array. The ultra thin single crystalline vertical transistors are located at the intersection of input lines 1012 and interconnect lines 1014. Not all of the ultra thin single crystalline vertical transistors are operatively connected in the first logic plane. Rather, the ultra thin single crystalline vertical transistors are selectively coupled to the input and interconnection lines so as to implement a desired logic function. Thus, some transistors are left unconnected. This selective interconnection is referred to as "mask programming" since the logical function implemented by the programmable logic array is "programmed" into the array by masking steps that are used in the generation of the conductors that interconnect the ultra thin single crystalline vertical transistors in the array.

In this embodiment, each of the interconnect lines 1014 acts as a NOR gate for the input lines 1012 that are connected to the interconnect lines 1014 through the ultra thin single crystalline vertical transistors of the array. For example, interconnection line 1014a acts as a NOR gate for the signals on input lines 1012a and 1012c. That is, p-channel pull up transistor 1016a maintains interconnect line 1014a at a high potential unless one or more of the ultra thin single crystalline vertical transistors that are coupled to interconnect line 1014a are turned on by a high logic level signal on an input line.

In a similar manner, second logic plane 1020 comprises a second array of ultra thin single crystalline vertical transistors that are selectively interconnected to provide the second level of the two level logic needed to implement a specific logical function. In this embodiment, the array of transistors is also configured such that the output lines 1018 comprise a logical NOR function of the signals from the interconnection lines 1014 that are coupled to particular output lines through the ultra thin single crystalline vertical transistors of the second logic plane 1020.

Figure 11A:
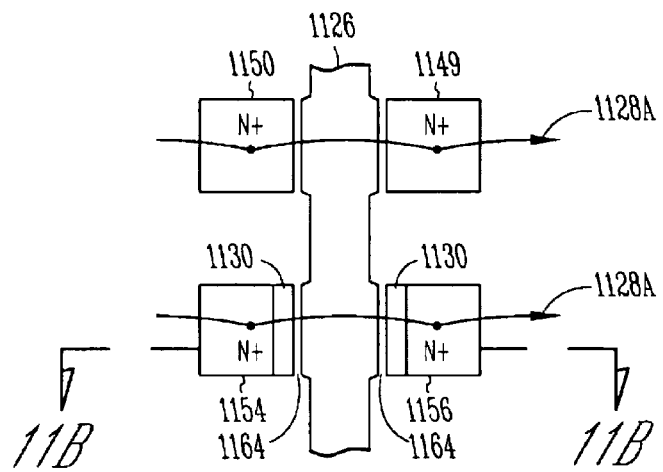
FIGS. 11A and 11B are top and front views of a portion of an embodiment of the programmable logic array of FIG. 10 showing horizontal replacement gates and ultra thin single crystalline vertical transistors along some sides of the pillars described above.
Figure 11B:
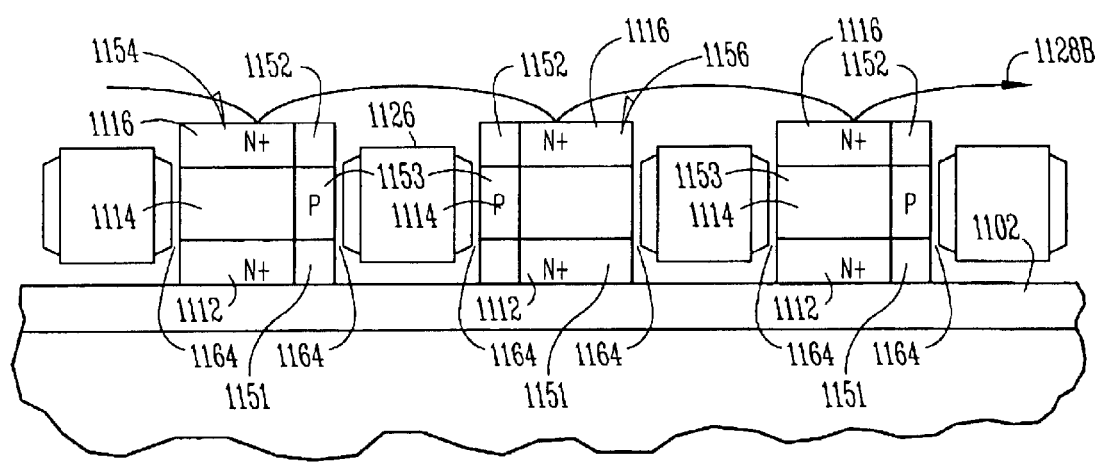

FIGS. 11A and 11B are top and front views of a portion of an embodiment of the programmable logic array 1000 of FIG. 10 showing horizontal gates, as the same have been described herein, and ultra thin single crystalline vertical transistors along some sides of the pillars described above. The portion of the embodiment can represent rows and columns of pillars, some having transistors formed alongside thereof according to the teachings of the present invention, in either the first logic plane 1010 or the second logic plane 1020 from FIG. 10. The discussion which immediately follows references rows and columns of pillars in the first logic plane 1010. In this embodiment, each of the input lines, 1012 from FIG. 10, is formed in a trench that separates rows of ultra thin single crystalline vertical transistors. For example, FIGS. 11A and 11B illustrate a conductive line 1126 which is housed in a trench that separates pillars 1150 and 1149, from pillars 1154 and 1156. In this embodiment, the conductive line represents an input line 1126 to the programmable logic array 1000 of FIG. 10. The electrical operation of the programmable logic array 1000 will be understood by one of ordinary skill in the art in viewing these figures. FIG. 11A illustrates that there may or may not be an ultra thin single crystalline vertical transistor 1130 on a particular side of the pillars and likewise there may or may not be an ultra thin single crystalline vertical transistor 1130 on the other side of the pillar adjacent any given trench. If there is not an ultrathin body transistor then the gate/input line 1126 just bypasses the pillar. Transistors can be formed both on the front and back of the pillars, in this case the back gate can be or can not be biased at the same time as the front polysilicon gate is biased. Note that in this case the back gate line is equivalent to the front gate in that it has the same structure as the gate for the transistor on the front of the pillar. There is thus no physical distinction between the front gate and the back gate. In this particular embodiment, the ultra thin single crystalline vertical body region of the ultra thin single crystalline vertical transistor is floating and fully depleted. The channels of the vertical devices are formed in the ultra thin single crystalline vertical transistor as described above. Input lines 1126 which gate the ultra thin single crystalline vertical transistors are formed by CVD deposition of either metal or poly silicon as described above. Contacts to the top-side metal address word lines used in the memory array can be made by using the conventional methods of contact hole etching.

In the embodiment shown in FIG. 11A, input line 1126 passes between pillars 1154 and 1156. Input line 1126 is separated from the ultra thin single crystalline vertical body region of the ultra thin single crystalline vertical transistors along side of pillars 1154 and 1156 by gate insulator 1164.

FIG. 11B shows a cross sectional view taken along cut line 11B in FIG. 11A. As described above, the ultra thin single crystalline vertical second source/drain region 1152 is coupled to a second contact layer 116 in pillar 1154. The second contact layer 1116 is coupled to interconnect line 1128B. The interconnect line 1128B is similarly coupled to the second contact layer 1116 in column adjacent pillars, e.g. 1156. In this manner, pillars 1154 and 1156 combine to provide the function of the first logic plane 1010 in FIG. 10. When a high logic level is applied to input line 1126, inversion layers are formed within the ultra thin single crystalline vertical body regions, e.g. 1153, of pillars 1154 and 1156 such that the pillars operate as metal-oxide-semiconductor field-effect transistors (MOSFET). By turning on these transistors, the interconnect line 1128B is brought to ground potential. Otherwise, when input line 1126 is grounded, the transistors are off and the interconnect line 1128B is allowed to maintain a high logic level, unaffected by the transistors.

As mentioned above, in the embodiment of FIGS. 11A and 11B not all of the pillars of PLA 1000 have an ultra thin single crystalline vertical transistor along side of the pillar which are coupled with input lines 1126. Some of the pillars are selectively left unused so as to implement a desired logical function. For example, pillars 1150 and 1149 are located at the intersection of input line 1126 and interconnect line 1128A. As shown in FIG. 11A, no transistor is required at this intersection in this embodiment. Thus, input line 1126 is a passing line between pillars 1150 and 1149.

In this embodiment, two pillars are used for each transistor in PLA 1000. Advantageously, this provides for redundancy in the performance of the logical function. If one of the pillars is defective or does not operate properly, the other pillar can continue to perform the logical operation. The cost of this redundancy is a decrease in circuit density because of the use of two pillars to perform the function of a single transistor.

As one of ordinary skill in the art will understand upon reading this disclosure, the portion of the embodiment of the programmable logic array 1000 of FIG. 10 represented in FIGS. 11A and 11B can equally represent a portion of the rows and columns of pillars in the second logic plane 1020 showing horizontal gates, as the same have been described herein, and ultra thin single crystalline vertical transistors along some sides of the pillars described above. In this embodiment, it is then an interconnect line 1126 which is located between pillars 1154 and 1156. As before, in this embodiment, the ultra thin single crystalline vertical second source/drain region 1152 is coupled to a second contact layer 1116 in pillar 1154. However, in the second contact plane 1020 the second contact layer 1116 for pillar 1154 is coupled to an output line 1128B. The output line 1128B is similarly coupled to the second contact layer 1116 in column adjacent pillars, e.g. 1156. In this manner, pillars 1154 and 1156 combine to provide the function of the second logic plane 1020 in FIG. 10. When a high logic level is applied to interconnect line 1126, inversion layers are formed within the ultra thin single crystalline vertical body regions, e.g. 1153, of pillars 1154 and 1156 such that the pillars operate as metal-oxide-semiconductor field-effect transistors (MOSFET). By turning on these transistors, the output line 1128B is brought to ground potential. Otherwise, when interconnect line 1126 is grounded, the transistors are off and the output line 1128 is allowed to maintain a high logic level, unaffected by the transistors.

As mentioned above, in the embodiment of FIGS. 11A and 11B representing the second logic plane 1020 not all of the pillars of PLA 1000 have an ultra thin single crystalline vertical transistor along side of the pillar which are coupled with interconnect lines 1126. Some of the pillars are selectively left unused so as to implement a desired logical function. For example, pillars 1150 and 1149 are located at the intersection of interconnect line 1126 and output line 1128A. In this embodiment of FIG. 11A representing a portion of the second logic plane 1020, no transistor is required at this intersection. Thus, interconnect line 1126 is a passing line between pillars 1150 and 1149.

Figure 12A:
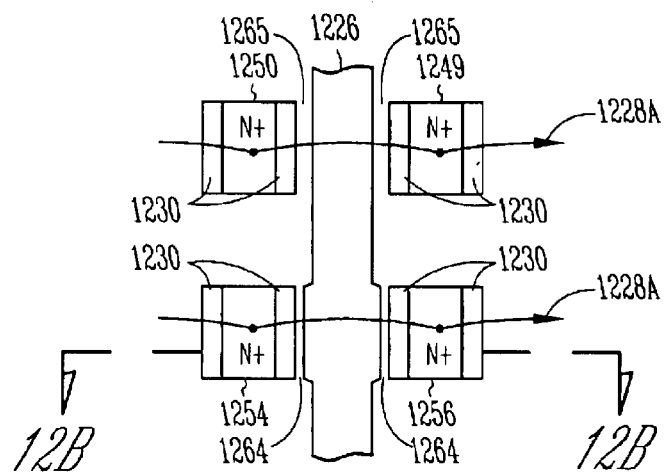
FIGS. 12A and 12B are top and front views of a portion of an embodiment of the programmable logic array of FIG. 10 showing horizontal replacement gates and ultra thin single crystalline vertical transistors along both sides of each pillar described above.
Figure 12B:
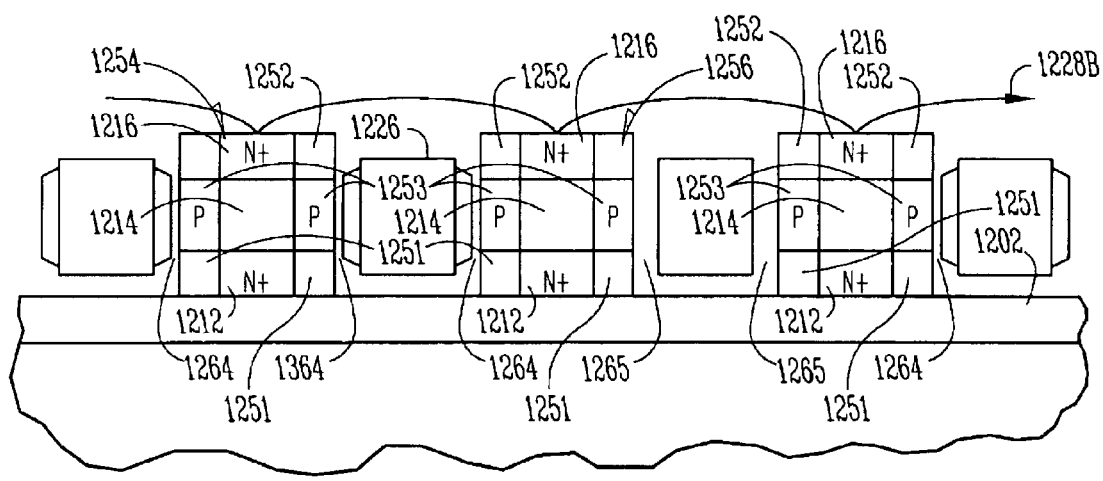

FIGS. 12A and 12B are top and front views of a portion of an embodiment of PLA 1000 of FIG. 10 showing horizontal gates, as the same has been described herein, and ultra thin single crystalline vertical transistors along both sides of each pillar described above. The portion of the embodiment can represent rows and columns of pillars in either the first logic plane 1010 or the second logic plane 1020 from FIG. 10. The discussion which immediately follows references rows and columns of pillars in the first logic plane 1010. In this embodiment, each of the input lines, 1012 from FIG. 10, is formed in a trench that separates rows of ultra thin single crystalline vertical transistors. For example, FIGS. 12A and 12B illustrate a conductive line 1226 which is housed in a trench that separates pillars 1250 and 1254, from pillars 1249 and 1256. In this embodiment, the conductive line represents an input line 1226 to the programmable logic array 1000 of FIG. 10. The electrical operation of the PLA circuit 1000 will be understood by one of ordinary skill in the art in viewing these figures. FIG. 12A illustrates that there may or may not be an ultra thin gate oxide 1264 separating the single crystalline vertical transistor 1230 on a particular side of the pillars and likewise there may or may not be an ultra thin gate oxide 1264 separating the single crystalline vertical transistor 1230 on the other side of the pillar. If there is not an ultra thin gate oxide 1264 then the gate/input line 1226 just bypasses the pillar. As shown in FIGS. 12A and 12B, input line 1226 is a passing line between pillars 1250 and 1249 with sufficient spacing, e.g. a thick oxide 1265 as described in connection with FIG. 7, from the pillars such that an inversion layer does not form in either pillar when a high voltage is applied to input line 1226. That is, the insulator, or thick oxide layer 1265 that separates pillars 1250 and 1249 from input line 1226 creates a transistor with a threshold voltage that is sufficiently high so as to exceed the most positive gate voltage to be applied to the input line 1226 in the first logic plane 1010 of PLA 1000 such that the transistor will never turn on.

FIG. 12B shows a cross sectional view taken along cut line 12B in FIG. 12A. As described above, the ultra thin single crystalline vertical second source/drain region 1252 is coupled to a second contact layer 1216 in pillar 1254. The second contact layer 1216 is coupled to interconnect line 1228B. The interconnect line 1228B is similarly coupled to the second contact layer 1216 in column adjacent pillars, e.g. 1256. In this manner, pillars 1254 and 1256 combine to provide the function of the first logic plane 1010 in PLA 1000 in FIG. 10. When a high logic level is applied to input line 1226, inversion layers are formed within the ultra thin single crystalline vertical body regions, e.g. 1253, of pillars 1254 and 1256 such that the pillars operate as metal-oxide-semiconductor field-effect transistors (MOSFET). By turning on these transistors, the interconnect line 1228B is brought to ground potential. Otherwise, when input line 1226 is grounded, the transistors are off and the interconnect line 1228B is allowed to maintain a high logic level, unaffected by the transistors.

As one of ordinary skill in the art will understand upon reading this disclosure, the portion of the embodiment of the programmable logic array 1000 of FIG. 10 represented in FIGS. 12A and 12B can equally represent a portion of the second logic plane 1020 showing horizontal gates, as the same have been described herein, and ultra thin single crystalline vertical transistors along both sides of each of the pillars described above. In this embodiment, it is then an interconnect line 1226 which is located between pillars 1254 and 1256. As before, in this embodiment, the ultra thin single crystalline vertical second source/drain region 1252 is coupled to a second contact layer 1216 in pillar 1254. However, in the second contact plane 1020 the second contact layer 1216 of pillar 1254 is coupled to an output line 1228B. The output line 1228B is similarly coupled to the second contact layer 1216 in column adjacent pillars, e.g. 1256. In this manner, pillars 1254 and 1256 combine to provide the function of the second logic plane 1020 in FIG. 10. When a high logic level is applied to interconnect line 1226, inversion layers are formed within the ultra thin single crystalline vertical body regions, e.g. 1253, of pillars 1254 and 1256 such that the ultra thin single crystalline vertical transistors along side of these pillars operate as metal-oxide-semiconductor field-effect transistors (MOSFET). By turning on these transistors, the output line 1228B is brought to ground potential. Otherwise, when interconnect line 1226 is grounded, the transistors are off and the output line 1228B is allowed to maintain a high logic level, unaffected by the transistors.

As mentioned above, in the embodiment of FIGS. 12A and 12B representing the second logic plane 1020 not all of the pillars of PLA 1000 have an ultra thin gate oxide 1264 separating the ultra thin single crystalline vertical transistor along side of the pillar from the interconnect lines 1226. Some of the pillars are selectively separated from the interconnect lines 1226 by a thick oxide 1265 such that the ultra thin single crystalline vertical transistor along side of the pillar is left unused so as to implement a desired logical function. For example, pillars 1250 and 1249 are located at the intersection of interconnect line 1226 and output line 1228A. In this embodiment of FIG. 12A representing a portion of the second logic plane 1020, no transistor is required at this intersection. Thus, interconnect line 1226 is a passing line between pillars 1250 and 1249.

Figure 13A:
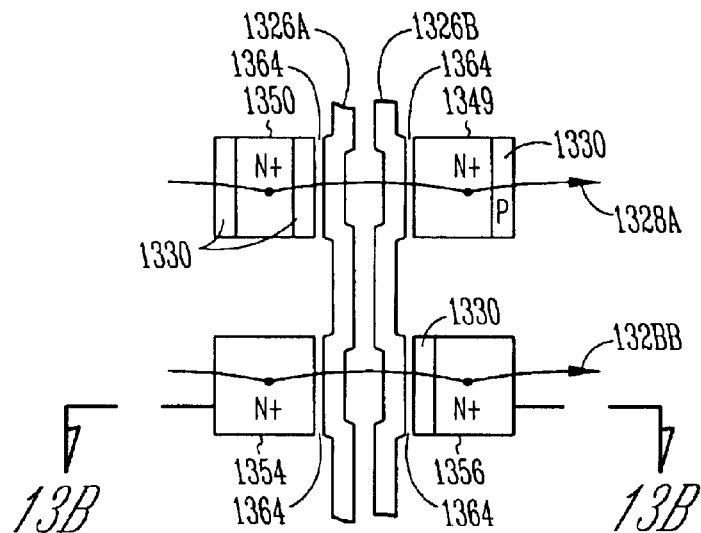
FIGS. 13A–13C are top and front views of a portion of an embodiment of the programmable logic array of FIG. 10 showing a vertical split gate/address line configuration and ultra thin single crystalline vertical transistors along some sides of the pillars described above.
Figure 13B:
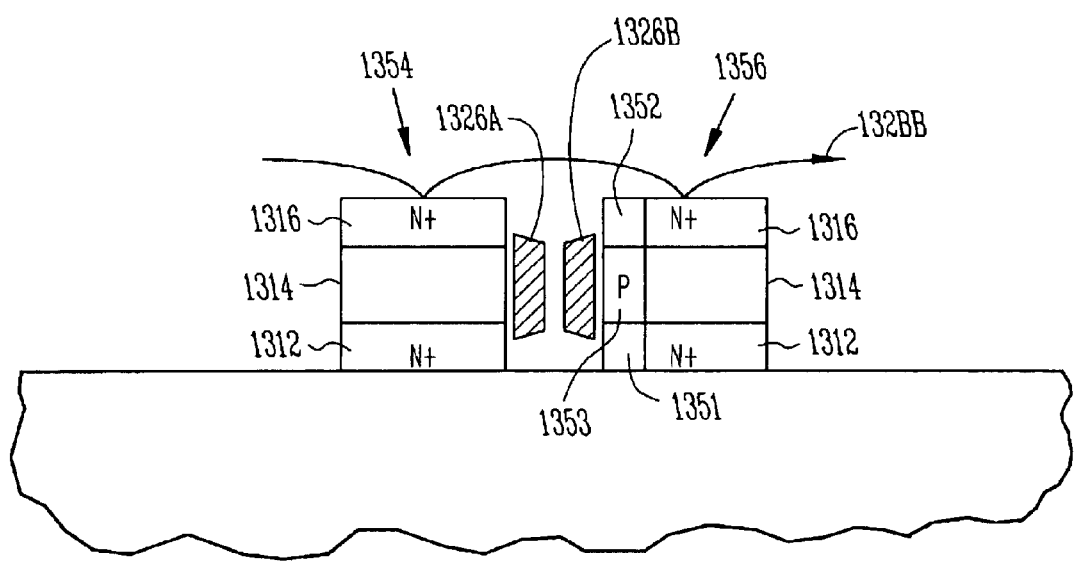

FIGS. 13A and 13B are top and front views of a portion of an embodiment of the first logic plane 1010 in PLA 1000 of FIG. 10 showing a vertical split gate/address line configuration, as the same has been described herein, and ultra thin single crystalline vertical transistors along some sides of the pillars described above. The portion of the embodiment can represent rows and columns of pillars in either the first logic plane 1010 or the second logic plane 1020 from FIG. 10. The discussion which immediately follows references rows and columns of pillars in the first logic plane 1010. In this embodiment, each of the input lines, 1012 from FIG. 10, is formed in a trench that separates rows of ultra thin single crystalline vertical transistors. For example, FIGS. 13A and 13B illustrate a conductive line 1326 which is housed in a trench that separates pillars 1350 and 1354, from pillars 1349 and 1356. In this embodiment, the conductive line represents an input line 1326 to the programmable logic array 1000 of FIG. 10. The electrical operation of this embodiment of the PLA circuit 1000 will be understood by one of ordinary skill in the art in viewing these figures. FIG. 13A illustrates that there may or may not be an ultra thin single crystalline vertical transistor 1330 on a particular side of the pillars and likewise there may or may not be an ultra thin single crystalline vertical transistor 1330 on the other side of the pillar. If there is not an ultrathin body transistor then the gate/input lines 1326A and 1326B just bypasses the pillar. Transistors can be formed both on the front and back of the pillars, in this case the back gate/input line can be or can not be biased at the same time as the front polysilicon gate/input line is biased. Note that in this case the back gate/input line is equivalent to the front gate/input line in that it has the same structure as the gate/input line for the transistor on the front of the pillar. There is thus no physical distinction between the front gate/input line and the back gate/input line. In this particular embodiment, the ultra thin single crystalline vertical body region 1353 of the ultra thin single crystalline vertical transistor is floating and fully depleted. The channels of the vertical devices are formed in the ultra thin single crystalline vertical transistor as described above. Input lines 1326A and 1326B which gate the ultra thin single crystalline vertical transistors are formed by CVD deposition of either metal or poly silicon as described above. Contacts to the top-side metal address word lines used in the memory array can be made by using the conventional methods of contact hole etching.

The input signals on the metal lines will be used to drive the ultra thin single crystalline vertical transistors in first and second logic planes, 1010 and 1020 from FIG. 10, to implement particular logic functions. Contacts and wiring at the metal level can be achieved using conventional techniques.

In the embodiment shown in FIG. 13A, input lines 1326A and 1326B pass between pillars 1354 and 1356. Input lines 1326A and 1326B are separated from the ultra thin single crystalline vertical body region 1353 of the ultra thin single crystalline vertical transistor by a thin gate oxide 1364, where the same are present along the pillars, e.g. along side of pillar 1364.

FIG. 13B shows a cross sectional view taken along cut line 13B in FIG. 13A. As described above, the ultra thin single crystalline vertical second source/drain 1352 region is coupled to a second contact layer 1316 in pillar 1354. The second contact layer 1316 in pillar 1354 is coupled to interconnect line 1328B. The interconnect line 1328B is similarly coupled to the second contact layer 1316 column adjacent pillars, e.g. 1356. In this manner, pillars 1354 and 1356 combine to provide the function of the first logic plane 1010 in PLA 1000 in FIG. 10. When a high logic level is applied to input lines 1326A and 1326B, inversion layers are formed within the adjacent ultra thin single crystalline vertical body regions, e.g. 1353, of pillar 1356 such that the ultra thin single crystalline vertical transistor adjacent this pillar operates as a metal-oxide-semiconductor field-effect transistors (MOSFET). By turning on this transistor, the interconnect line 1328B is brought to ground potential. Otherwise, when input lines 1326A and 1326B are grounded, the transistors are off and the interconnect line 1328B is allowed to maintain a high logic level, unaffected by the transistors.

As mentioned above, in the embodiment of FIGS. 13A and 13B not all of the pillars of PLA 1000 have an ultra thin single crystalline vertical transistor along side of the pillar which are coupled with input lines 1326A and 1326B. Some of the pillars are selectively left unused by not forming an ultra thin single crystalline vertical transistor along side of the pillar so as to implement a desired logical function. For example, pillar 1354 does have an ultra thin single crystalline vertical transistor along side of the pillar at the intersection of input line 1326A and interconnect line 1328B. Pillar 1349 does not have an ultra thin single crystalline vertical transistor along side of the pillar at the intersection of input line 1326B and interconnect line 1328A. As shown in FIG. 13A, no transistor is required at this intersection in this embodiment. Thus, input line 1326A is a passing line for pillar 1354, and input line 1326B is a passing line for pillar 1349.

As one of ordinary skill in the art will understand upon reading this disclosure, the portion of the embodiment of the programmable logic array 1000 of FIG. 10 represented in FIGS. 13A and 13B can equally represent a portion of the second logic plane 1020 showing horizontal replacement gates, as the same have been described herein, and ultra thin single crystalline vertical transistors along some sides of the pillars described above. In this embodiment, it is then a pair of interconnect lines 1326A and 1326B which are located between pillars 1354 and 1356 in the second logic plane 1020. As before, in this embodiment, the ultra thin single crystalline vertical second source/drain region 1352 is coupled to a second contact layer 1316 in pillar 1354. However, in the second logic plane 1020 the second contact layer 1316 of pillar 1354 is coupled to an output line 1328B.

The output line 1328B is similarly coupled to the second contact layer 1316 in column adjacent pillars, e.g. 1356. In this manner, pillars 1354 and 1356 combine to provide the function of the second logic plane 1020 in FIG. 10. When a high logic level is applied to interconnect lines 1326A and 1326B, inversion layers are formed within the ultra thin single crystalline vertical body regions, e.g. 1353, of pillar 1350 and 1356 such that the ultra thin single crystalline vertical transistors adjacent these pillars operate as metal-oxide-semiconductor field-effect transistors (MOSFET). By turning on these transistors, the output lines 1328A and 1328B are brought to ground potential. Otherwise, when interconnect lines 1326A and 1326B are grounded, the transistors are off and the output lines 1328A and 1328B are allowed to maintain a high logic level, unaffected by the transistors.

As mentioned above, in the embodiment of FIGS. 13A and 13B representing the second logic plane 1020 not all of the pillars of PLA 1000 have an ultra thin single crystalline vertical transistor along side of the pillar which are coupled with adjacent interconnect lines 1326A and 1326B. Some of the pillars are selectively left unused by not forming an ultra thin single crystalline vertical along side of the pillar so as to implement a desired logical function. For example, pillar 1354 is located at the intersection of interconnect line 1326A and output line 1328B. In this embodiment of FIG. 13A representing a portion of the second logic plane 1020, no transistor is required at this intersection. Thus, interconnect line 1326A is a passing line between pillars 1354 and 1356. Analogously, interconnect line 1326B is a passing line between pillars 1350 and 1349.

Figure 13C:
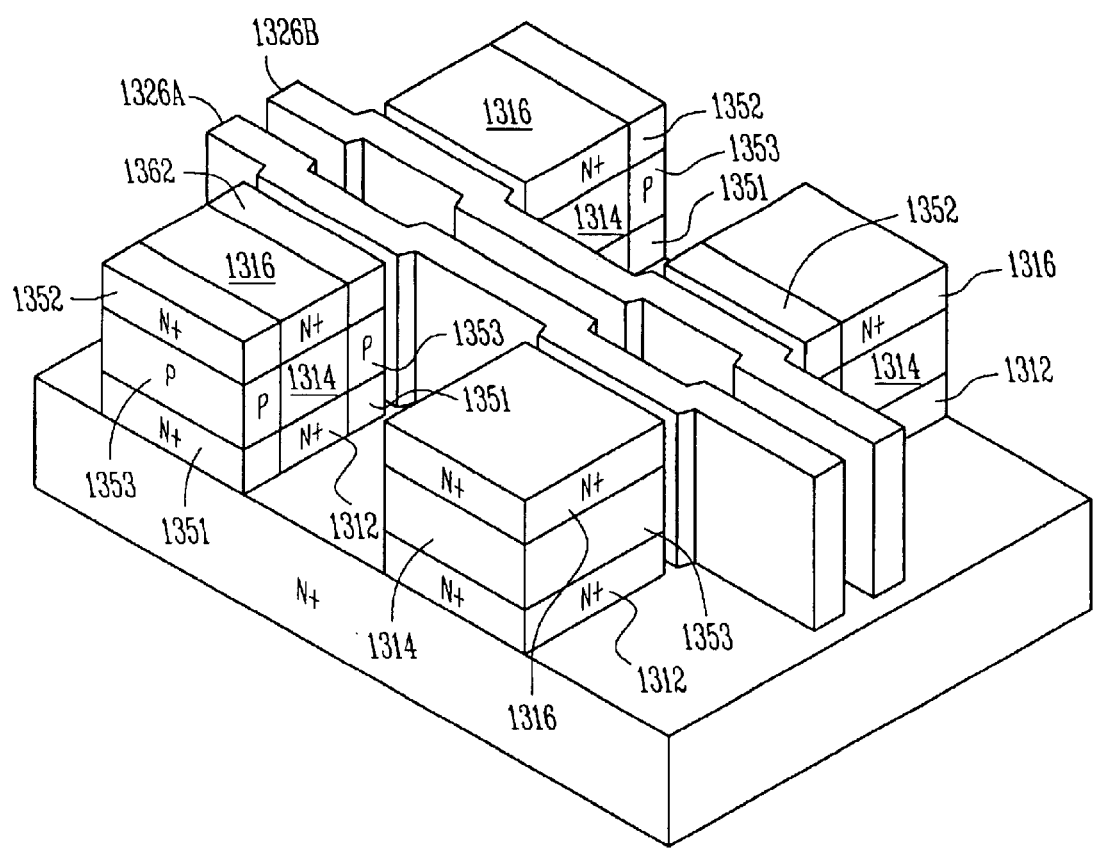

FIG. 13C is a perspective view of this embodiment whether it be in the first of the second logic planes, 1010 and 1020 respectively. In the split gate configuration a much higher density of the PLA 1000 is achieved. The embodiment using split or separate input lines 1326 in the first logic plane 1010, or split interconnect line 1326 in the second logic plane 1020 is also understood in connection with FIG. 7. These embodiments offer the benefit of substantially reducing the area associated with each device. Here the ultra thin single crystalline vertical transistors in a given row or column in the PLA 1000 have a single gate/input line 1326 in the first logic plane 1010, and a single gate/interconnect line 1326 in the second logic plane 1020 for each input signal or interconnect signal, respectively. None of these input signals on input lines 1326 or interconnect signals on interconnect lines 1326 appear as gate potentials for the ultra thin single crystalline vertical transistors in trench opposing pillars. The split input lines 1326 in the first logic plane 1010, or the split interconnect line 1326 in the second logic plane 1020 can be separated after a single conductive line deposition by performing a directional etch following deposition to leave the conductor on the vertical sidewalls only. The same has been explained in more detail in connection with FIG. 7.

Details of the fabrication can utilize the general techniques which we have described above in the fabrication of the ultra thin single crystalline vertical transistors along side of the pillars in either bulk or SOI technology. As one of ordinary skill in the art will understand upon reading this disclosure, the split input lines 1326 in the first logic plane 1010, or the split interconnect line 1326 in the second logic plane 1020 scheme will be similar to the open bit line address scheme in DRAMs where the address lines are split. The pillars are always gated on both sides, the logic is programmed into the array by determining whether or not there is an ultra thin single crystalline vertical transistor on the side of the pillar adjacent to the split input lines 1326 in the first logic plane 1010, or the split interconnect lines 1326 in the second logic plane 1020 in order to form a transistor 1330.

Figure 14A:
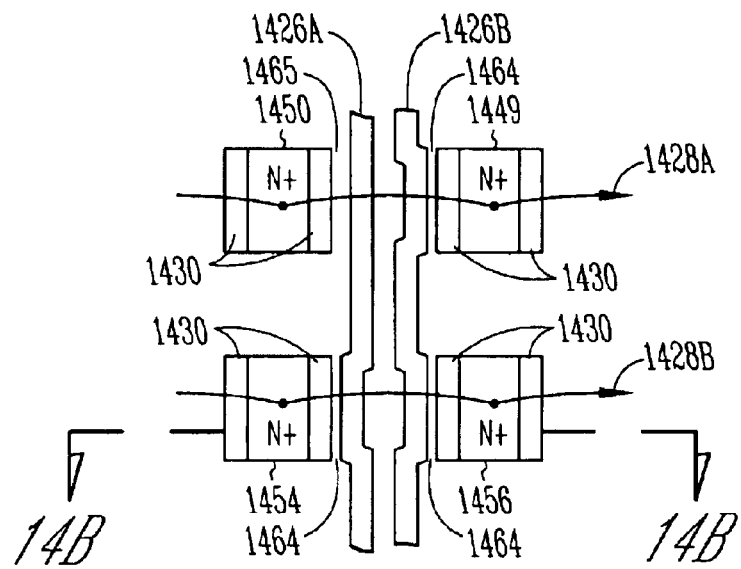
FIGS. 14A–14C are top and front views of a portion of an embodiment of the programmable logic array of FIG. 10 showing vertical gates and ultra thin single crystalline vertical transistors along both sides of each pillar described above.
Figure 14B:
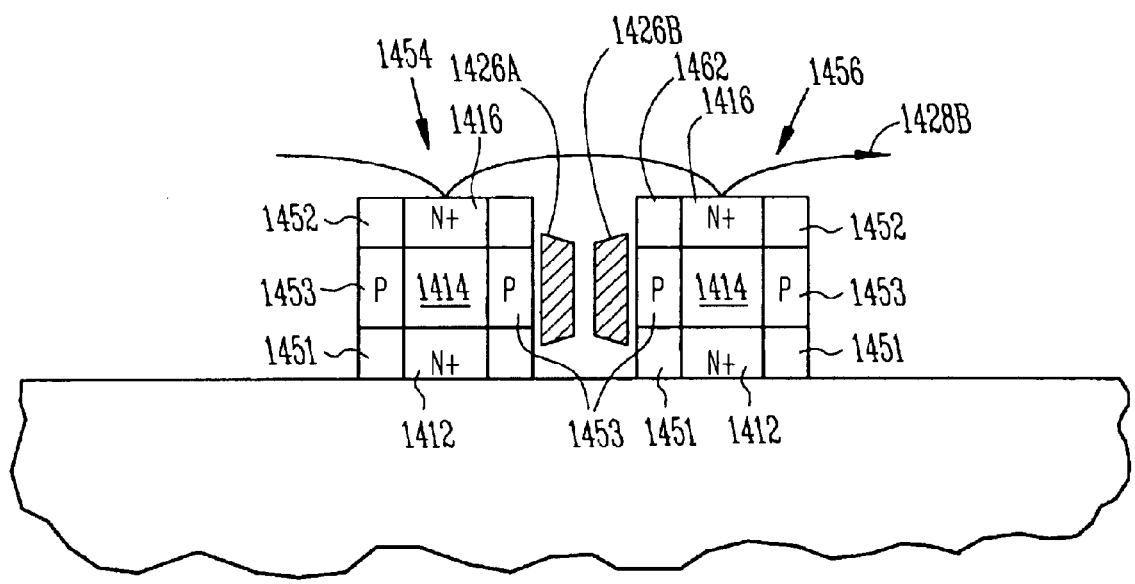

FIGS. 14A and 14B are top and front views of a portion of an embodiment of decoder 1100 of FIG. 11 showing vertical gates, as the same has been described herein, and ultra thin single crystalline vertical transistors along both sides of each pillar described above. The portion of the embodiment can represent rows and columns of pillars in either the first logic plane 1010 or the second logic plane 1020 from FIG. 10. The discussion which immediately follows references rows and columns of pillars in the first logic plane 1010. In this embodiment, each of the input lines, 1012 from FIG. 10, is formed in a trench that separates rows of ultra thin single crystalline vertical transistors. For example, FIGS. 14A and 14B illustrate a conductive line 1426 which is housed in a trench that separates pillars 1450 and 1454, from pillars 1449 and 1456. In this embodiment, the conductive line represents an input line 1426 to the programmable logic array 1000 of FIG. 10. The electrical operation of the PLA 1000 will be understood by one of ordinary skill in the art in viewing these figures. FIG. 14A illustrates that there may or may not be an ultra thin gate oxide 1464 separating the single crystalline vertical transistor 1430 on a particular side of the pillars and likewise there may or may not be an an ultra thin gate oxide 1464 separating the single crystalline vertical transistor 1430 on the other side of the pillar. If there is not an ultra thin gate oxide 1464 then the gate address lines just bypasses the pillar. As shown in FIGS. 14A and 14B, input line 1426A is a passing line for pillar 1450 with sufficient spacing, e.g. a thick oxide 1465 as described in connection with FIG. 7, from the pillar 1450 such that an inversion layer does not form in this pillar when a high voltage is applied to input line 1426A. That is, the insulator, or thick oxide layer 1465 that separates pillar 1450 from input line 1426A creates a transistor with a threshold voltage that is sufficiently high so as to exceed the most positive gate voltage to be applied in PLA 1000 such that the transistor will never turn on.

FIG. 14B shows a cross sectional view taken along cut line 14B in FIG. 14A. As described above, the ultra thin single crystalline vertical second source/drain region 1452 is coupled to a second contact layer 1416 in pillar 1454. The second contact layer 1416 in pillar 1454 is coupled to interconnect line 1428B. The interconnect line 1428B is similarly coupled to the second contact layer 1416 column adjacent pillars, e.g. 1456. In this manner, pillars 1454 and 1456 combine to provide the function of the first logic plane 1010 of PLA 1000 in FIG. 10. When a high logic level is applied to input lines 1426A and 1426B, inversion layers are formed within the ultra thin single crystalline vertical body regions, e.g. 1453, of pillars 1454 and 1456 such that the ultra thin single crystalline vertical transistors in these pillars operate as metal-oxide-semiconductor field-effect transistors (MOSFET). By turning on these ultra thin single crystalline vertical transistors, the interconnect line 1428B is brought to ground potential. Otherwise, when input lines 1426A and 1426B are grounded, the ultra thin single crystalline vertical transistors are off and the interconnect line 1428B is allowed to maintain a high logic level, unaffected by the transistors.

As one of ordinary skill in the art will understand upon reading this disclosure, the portion of the embodiment of the programmable logic array 1000 of FIG. 10 represented in FIGS. 14A and 14B can equally represent a portion of the second logic plane 1020 showing vertical split gates, as the same have been described herein, and ultra thin single crystalline vertical transistors along both sides of each of the pillars described above. In this embodiment, it is then a pair of interconnect lines 1426A and 1426B which are located between pillars 1454 and 1456. As before, in this embodiment, the ultra thin single crystalline vertical second source/drain region 1462 is coupled to a second contact layer 1416 in pillar 1454. However, in the second contact plane 1020 the second contact layer 1416 in pillar 1454 is coupled to an output line 1428B. The output line 1428B is similarly coupled to the second contact layer 1416 in column adjacent pillars, e.g. 1456. In this manner, pillars 1454 and 1456 combine to provide the function of the second logic plane 1020 in FIG. 10. When a high logic level is applied to interconnect lines 1426A and 1426B, inversion layers are formed within the ultra thin single crystalline vertical body regions, e.g. 1453, of pillars 1454 and 1454 such that the ultra thin single crystalline vertical transistors along side of these pillars operate as metal-oxide-semiconductor field-effect transistors (MOSFET). By turning on these transistors, the output line 1428B is brought to ground potential. Otherwise, when interconnect lines 1426A and 1426B are grounded, the transistors are off and the output line 1428B is allowed to maintain a high logic level, unaffected by the transistors.

As mentioned above, in the embodiment of FIGS. 14A and 14B representing the second logic plane 1020 not all of the pillars of PLA 1000 have an ultra thin gate oxide 1464 separating the ultra thin single crystalline vertical transistor along side of the pillar from the interconnect lines 1426A and 1426B. Some of the pillars are selectively separated from the interconnect lines 1426A and 1426B by a thick oxide 1465 such that the ultra thin single crystalline vertical transistor along side of the pillar is left unused so as to implement a desired logical function. For example, pillar 1450 is located at the intersection of interconnect line 1426A and output line 1428A. In this embodiment of FIG. 14A representing a portion of the second logic plane 1020, no transistor is required at this intersection. Thus, interconnect line 1426A is a passing line between pillars 1450 and 1449.

Figure 14C:
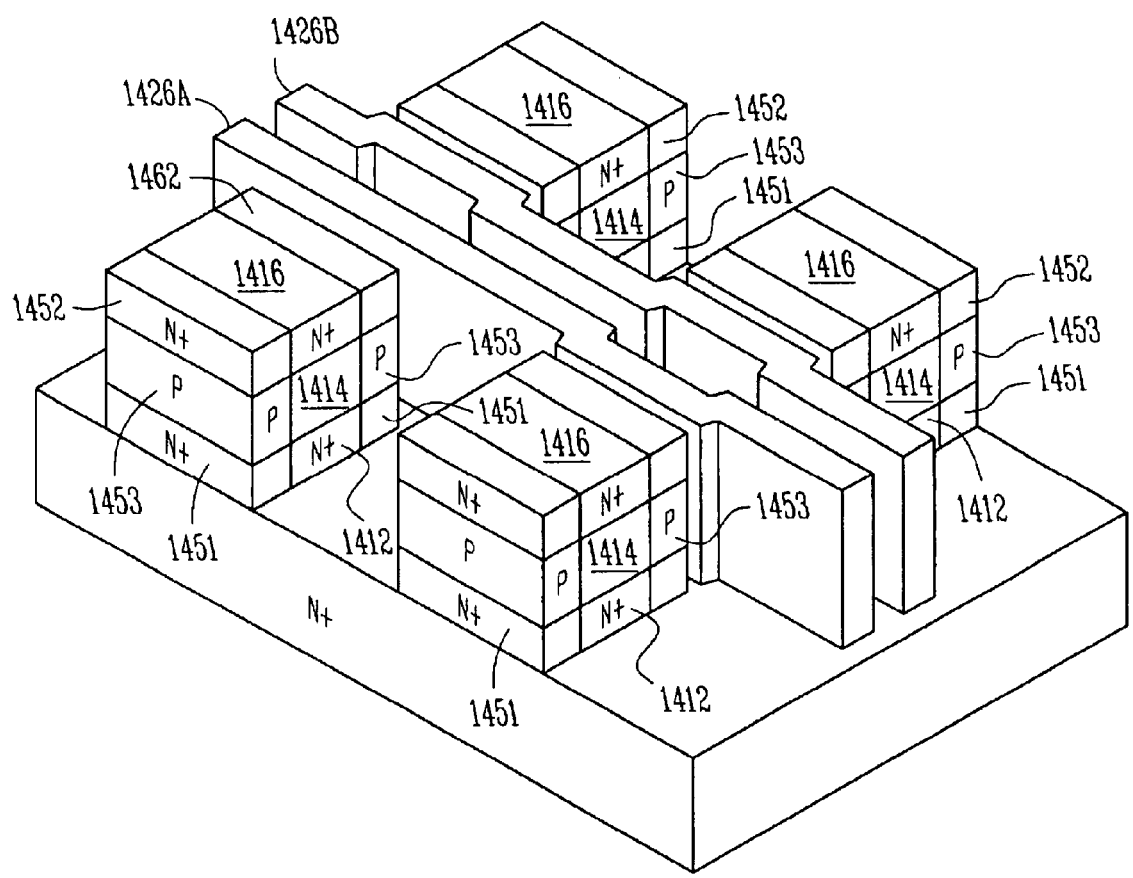

FIG. 14C is a perspective view of this embodiment whether it be in the first or the second logic planes, 1010 and 1020 respectively. In the split gate configuration a much higher density of the PLA 1000 is achieved. The embodiment using split or separate input lines 1426 in the first logic plane 1010, or split interconnect lines 1426 in the second logic plane 1020 is also understood in connection with FIG. 7. These embodiments offer the benefit of substantially reducing the area associated with each device. Here the ultra thin single crystalline vertical transistors in a given row or column in the PLA 1000 have a single gate/input line 1426 in the first logic plane 1010, and a single gate/interconnect line 1426 in the second logic plane 1020 for each input signal or interconnect signal, respectively. None of these input signals on input lines 1426 or interconnect signals on interconnect lines 1426 appear as gate potentials for the ultra thin single crystalline vertical transistors in trench opposing pillars. The split input lines 1426 in the first logic plane 1010, or the split interconnect lines 1426 in the second logic plane 1020 can be separated after a single conductive line deposition by performing a directional etch following deposition to leave the conductor on the vertical sidewalls only. The same has been explained in more detail in connection with FIG. 7.

Details of the fabrication are similar to the techniques described above in the fabrication of ultra thin single crystalline vertical transistors along side of the pillars either bulk or SOI technology, except here now additional process steps, as explained in connection with FIG. 7 are incorporated to allow the gate/input lines 1426 in the first logic plane or gate/interconnect lines 1426 in the second logic plane to bypass some pillars without activating the ultra thin single crystalline vertical transistors 1430 thereby. Again, this embodiment is referred to as the split input line 1426 or the split interconnect line 1426 embodiment, respectively, because two lines are placed between rows of pillars. The advantage of the split input line 1426 or the split interconnect line 1426 embodiment, respectively, is that the function of each transistor in PLA 1000 is implemented in a single pillar. This produces a significant increase in the density of PLA 1000.

In many of the above referenced drawings an n-channel type transistor has been depicted. However, one of ordinary skill in the art will further understand upon reading this disclosure that the conductivity types described herein can be reversed by altering doping types such that the present invention is equally applicable to include structures having ultra thin vertically oriented single crystalline p-channel type transistors. The invention is not so limited.

CONCLUSION

Embodiments of the present invention provide a programmable logic array with an increased density with respect to conventional programmable logic arrays. Specifically, ultra thin single crystalline vertical transistors are used at the intersection of the input lines, interconnect lines, and output lines in a first and a second logic plane respectively. The ultra thin single crystalline vertical transistors are selectively coupled by mask programming to these lines so as to implement a desired logical function.

In the solid gate implementation a high density PLA is achieved by having the address lines in trenches and utilizing the ultra thin single crystalline vertical transistors. The ultra thin vertical body structures allow transistor operation with dimensions less than 100 nm, further increasing density while suppressing short-channel effects such as drain-induced barrier lowering; threshold voltage roll off, and sub-threshold conduction. In the embodiment with split gate lines there can be separate transistors on either one or both sides of the pillar. Both of these lines could be used as normal address lines resulting in an even larger increase in the density of programmable logic arrays. Each pillar acts as a two input NOR gate rather than having to use two pillars to achieve the same logic function, basically doubling the density of the logic array.

It is to be understood that the above description is intended to be illustrative, and not restrictive. Many other embodiments will be apparent to those of skill in the art upon reviewing the above description. For example, the logical function implemented by the programmable logic array can be varied without departing from the scope of the present invention. Further, the number of input lines, interconnect lines, and output lines can be similarly varied for a specific application. Thus, the scope of the invention is not limited to the particular embodiments shown and described herein.

What is claimed:

1. A programmable logic array, comprising:
    a plurality of inputs;
    a plurality of outputs; and
    a plurality of vertical transistors including a first number of transistors coupled to the inputs and a second number of transistors coupled to the outputs, the plurality of vertical transistors being interconnected in a predetermined manner to receive an input signal on the inputs and provide an output signal on the outputs according to a predetermined logic function, wherein each vertical transistor includes:
        a single crystalline semiconductor material formed along a side of a vertical pillar that extends outwardly from a substrate, the single crystalline semiconductor material having a width extending away from the vertical pillar of less than 10 nm;
        a first diffusion region of a first conductivity type formed in the single crystalline semiconductor material;
        a second diffusion region of the first conductivity type formed in the single crystalline semiconductor material; and
        a body region of a second conductivity type separating the first and the second diffusion regions.

2. The array of claim 1, wherein the body region has a vertical length less than 100 nm.

3. The array of claim 1, wherein the single crystalline semiconductor material includes a single crystalline silicon material.

4. The array of claim 1 wherein the plurality fo vertical transistors are organized into a first logic plane and a second logic plane to provide a two-level logic configuration.

5. A programmable logic array, comprising:
    a plurality of inputs;
    a plurality of outputs; and
    a plurality of vertical transistors including a number of transistors coupled to the inputs and a number of transistors coupled to the outputs, the vertical transistors being interconnected in a predetermined manner to receive an input signal on the inputs and provide an output signal on the outputs according to a combination of predetermined logic functions for a number of logic levels to provide a multi-level logic configuration, wherein each vertical transistor includes:
        a single crystalline silicon material formed along a side of a vertical pillar that extends outwardly from a substrate, the single crystalline semiconductor material having a width extending away from the pillar of less than 10 nm and having a vertical length less than 100 nm;
        a first diffusion region of a first conductivity type formed in the single crystalline semiconductor material;
        a second diffusion region of the first conductivity type formed in the single crystalline semiconductor material; and
        a body region of a second conductivity type separating the first and the second diffusion regions.

6. The array of claim 5, wherein the multi-level logic configuration includes one of: a NOR—NOR logic configuration; an AND-OR logic configuration; an OR-AND logic configuration; a NAND—NAND logic configuration; a NOR-OR logic configuration; an OR-NOR logic configuration; an AND-NOR logic configuration; and a NAND-AND logic configuration.

7. A programmable logic array, comprising:
    a plurality of inputs;
    a plurality of outputs; and
    a plurality of vertical transistors including a number of transistors coupled to the inputs and a number of transistors coupled to the outputs, the vertical transistors being interconnected in a predetermined manner to receive an input signal on the inputs and provide an output signal on the outputs according to a predetermined logic function, wherein each vertical transistor includes a single crystalline semiconductor material formed along a side of a vertical pillar that extends outwardly from a substrate, the single crystalline silicon material having a width extending away from the pillar of less than 10 nm, a first diffusion region of a first conductivity type, a second diffusion region of the first conductivity type, and a body region of a second conductivity type separating the first and the second diffusion regions, wherein the body region is less than 100 nm in length.

8. The array of claim 7, wherein the plurality of vertical transistors are arranged in a two-level logic configuration.

9. The array of claim 7, wherein the two-level logic configuration includes one of: a NOR—NOR logic configuration; an AND-OR logic configuration; an OR-AND logic configuration; a NAND—NAND logic configuration; a NOR-OR logic configuration; an OR-NOR logic configuration; an AND-NOR logic configuration; and a NAND-AND logic configuration.

10. A programmable logic array, comprising:
a first logic plane having a plurality of first logic plane inputs and a plurality of first logic plane outputs, the first logic plane including a first number of vertical transistors interconnected in a predetermined manner to receive a first input signal on the inputs and provide a first output signal on the first logic level outputs according to a predetermined first logic level;
a second logic plane having a plurality of second logic plane inputs and a plurality of second logic plane outputs, the second logic plane including a second number of vertical transistors interconnected in a predetermined manner to receive a second input signal on the second logic plane inputs and provide a second logic plane output signal on the second logic plane outputs according to a predetermined second logic level;
the first logic plane outputs being selectively connected to the second logic plane inputs to provide a desired logical function for the first logic plane and the second logic plane; and
each of the first number of vertical transistors and the second number of vertical transistors including a first diffusion region, a second diffusion region, and a body region between the first and second diffusion regions; wherein the first diffusion region, the body region and the second diffusion region are formed in a single crystalline semiconductor material, and the single crystalline semiconductor material is formed on a side of a vertical pillar extending outward from a substrate.

11. The logic array of claim 10, wherein the first logic plane, the second logic plane and the connection between the first logic plane and the second logic plane provide a two-level logic configuration.

12. A programmable logic array, comprising:
a plurality of pillars extending outwardly from a substrate;
a plurality of vertical transistors, each vertical transistor being formed in an ultra thin single crystalline semiconductor material on a side of each pillar, each vertical transistor including:
a first source/drain region of a first conductivity type;
a body region of a second conductivity type located above the first source/drain region; and
a second source/drain region of the first conductivity type located above the body region; and
the vertical transistors being interconnected in a predetermined manner to receive an input signal and provide an output signal according to a predetermined logic function.

13. The array of claim 12, wherein the single crystalline semiconductor material includes a single crystalline silicon material.

14. The array of claim 12, wherein the single crystalline semiconductor material has a width extending away from the vertical pillar of less than 10 nm.

15. The array of claim 14, wherein the single crystalline semiconductor material has a vertical length of less than 100 nm.

16. A programmable logic array, comprising:
a plurality of pillars extending outwardly from a substrate;
a plurality of vertical transistors, each vertical transistor being formed in a single crystalline silicon material on a side of each of the pillars, each vertical transistor including:
a first source/drain region of a first conductivity type;
a body region of a second conductivity type located above the first source/drain region; and
a second source/drain region of the first conductivity type located above the body region; and
the vertical transistors being organized into a first logic plane having a number of first inputs and a number of first outputs, and into a second logic plane having a number of second inputs and a number of second outputs, the vertical transistors in the first logic plane being interconnected in a predetermined manner to receive a first input signal and provide a first logic plane output signal according to a first logic level, the vertical transistors in the second logic plane being interconnected in a predetermined manner to receive a second logic plane input signal and provide a second logic plane output signal according to a second logic level.

17. The array of claim 16, wherein the plurality of pillars includes a single crystalline first contact layer, an oxide layer on the first contact layer and a second contact layer on the oxide layer.

18. The array of claim 17, wherein the first contact layer is formed with a buried line.

19. The array of claim 17, further comprising a number of input lines formed to selectively gate the vertical transistors.

20. A method of forming a programmable logic array, comprising:
forming a plurality of inputs;
forming a plurality of outputs; and
forming a plurality of vertical transistors including:
forming a number of transistors coupled to the inputs;
forming a number of transistors coupled to the outputs,
interconnecting the vertical transistors to receive an input signal on the inputs and provide an output signal on the outputs according to a predetermined logic function,
wherein for each vertical transistor, forming a plurality of vertical transistors includes:
forming a single crystalline semiconductor material along a side of a vertical pillar that extends outwardly from a substrate, including forming the single crystalline semiconductor material less than 10 nm wide extending away from the pillar;
forming a first diffusion region of a first conductivity type in the single crystalline semiconductor material;
forming a second diffusion region of the first conductivity type in the single crystalline semiconductor material; and
forming a body region of a second conductivity type in the single crystalline semiconductor material to separate the first and the second diffusion regions.

21. The method of claim 20, wherein forming a single crystalline semiconductor material includes forming a single crystalline silicon material.

22. The method of claim 20, wherein forming a single crystalline semiconductor material includes forming the single crystalline semiconductor material via a solid phase epitaxial growth process.

23. The method of claim 22, wherein forming the single crystalline semiconductor material via a solid phase epitaxial growth process includes annealing polysilicon.

24. The method of claim 23, wherein forming a first diffusion region includes diffusing dopants from a first contact layer during annealing, and forming a second diffusion region includes diffusing dopants from as second contact layer during annealing.

25. A method of forming a programmable logic array, comprising:

forming a plurality of pillars extending outwardly from a substrate;

forming a single crystalline semiconductor material along at least one side of a number of the pillars;

forming a first source/drain region of a first conductivity type in the single crystalline semiconductor material;

forming a second source/drain region of a first conductivity type in the single crystalline semiconductor material; and forming a body region of a second conductivity type in the single crystalline semiconductor material to separate the first and second source/drain regions.

26. The method of claim 25, wherein forming a single crystalline semiconductor material includes forming the single crystalline semiconductor material via a solid phase epitaxial growth process.

27. The method of claim 26, wherein forming the single crystalline semiconductor material via a solid phase epitaxial growth process includes annealing, forming a first source/drain region includes diffusing dopants from a first contact layer during annealing; and forming a second source/drain region includes diffusing dopants from a second contact layer during annealing.

28. A method of forming a programmable logic array, comprising:

forming a first logic plane of a first number of vertical transistors, including:

for each of the first number of vertical transistors, forming a single crystalline semiconductor material along at least one side of a pillar that extends outwardly from a substrate;

forming a first and a second source/drain region of a first conductivity type in the single crystalline semiconductor material; and forming a body region of a second conductivity type in the single crystalline material to separate the first and the second source/drain regions; and forming a second logic plane of a second number of vertical transistors, including:

for each of the second number of vertical transistors, forming a single crystalline semiconductor material along at least one side of a pillar that extends outwardly from a substrate;

forming a first and a second source/drain region of a first conductivity type in the single crystalline semiconductor material; and forming a body region of a second conductivity type in the single crystalline material to separate the first and the second source/drain regions.

29. The method of claim 28, wherein forming a single crystalline semiconductor material includes forming a single crystalline silicon material using a solid phase epitaxial growth process.

30. The method of claim 28, wherein forming a first logic plane of a first number of vertical transistors includes connecting the first number of vertical transistors to provide a first logic function, and forming a second logic plane of a second number of vertical transistors includes connecting the second number of vertical transistors to provide a second logic function, the method further comprising connecting the first logic plane to the second logic plane to provide a desired two-level logic function.

31. The method of claim 30, wherein the desired two-level logic function includes one of: a NOR—NOR logic configuration; an AND-OR logic configuration; an OR-AND logic configuration; a NAND—NAND logic configuration; a NOR-OR logic configuration; an OR-NOR logic configuration; an AND-NOR logic configuration; and a NAND-AND logic configuration.

* * * * *

UNITED STATES PATENT AND TRADEMARK OFFICE
CERTIFICATE OF CORRECTION

PATENT NO. : 6,894,532 B2
DATED : May 17, 2005
INVENTOR(S) : Leonard Forbes and Kie Y. Ahn It is certified that error appears in the above-identified patent and that said Letters Patent is hereby corrected as shown below:

Title page,
Item [56], References Cited, U.S. PATENT DOCUMENTS,
delete "158/657" and insert -- 156/657 --, therefor.
delete "437/62" and insert -- 437/52 --, therefor.
delete "437/36" and insert -- 437/35 --, therefor.
delete "437/62" and insert -- 437/52 --, therefor.
below "5,053,351" insert -- 5,057,896   10/1991    Gotou    357/49 --, therefor.
delete "437/62" and insert -- 437/52 --, therefor.
delete "118/723.1" and insert -- 118/723 1 --, therefor.
below "5,891,773" insert -- 5,907,170   05/1999    Forbes et al.    257/296 --.
below "6,040,218" insert -- 6,066,869   05/2000    Noble et al.    257/296 --.
insert -- FOREIGN PATENT DOCUMENTS
 JP-63-066963  03/25/1988     H01 L/27/10 --.

OTHER PUBLICATIONS,
"Xuan, P, et al." reference, delete "(2002)" and insert -- (2000) --, therefor.
"Bomchil, G.," reference, delete "(1969)" and insert -- (1989) --, therefor.
"De, V. K.," reference, after "technology," delete "Digest of Technology,".
"Fong, Y.," reference, delete "583-690" and insert -- 583-590 --, therefor.
"Hu, G.," reference, delete "Willi" and insert -- Will --, therefor.
"Stellwag, T. B.," reference, after "devices," insert -- 38, --.
"Takato, H.," reference, delete "Surronding" and insert -- Surrounding --, therefor.
"Temmler, D.," reference, delete "84" and insert -- 64 --, therefor.

Column 6,
Line 8, delete "100 m" and insert -- 100nm --, therefor.

Column 13,
Line 65, delete "116" and insert -- 1116 --, therefor.

UNITED STATES PATENT AND TRADEMARK OFFICE
CERTIFICATE OF CORRECTION

PATENT NO. : 6,894,532 B2
DATED : May 17, 2005
INVENTOR(S) : Leonard Forbes and Kie Y. Ahn It is certified that error appears in the above-identified patent and that said Letters Patent is hereby corrected as shown below:

Column 22,
Line 8, delete "fo" and insert -- of --, therefor.

Signed and Sealed this

First Day of November, 2005

JON W. DUDAS
*Director of the United States Patent and Trademark Office*